(12) United States Patent
Park et al.

(10) Patent No.: US 11,972,111 B2
(45) Date of Patent: Apr. 30, 2024

(54) MEMORY DEVICE FOR IMPROVING SPEED OF PROGRAM OPERATION AND OPERATING METHOD THEREOF

(71) Applicant: Samsung Electronics Co., Ltd., Suwon-si (KR)

(72) Inventors: Junyong Park, Suwon-si (KR); Minseok Kim, Suwon-si (KR); Jisu Kim, Suwon-si (KR); Ilhan Park, Suwon-si (KR); Doohyun Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/052,350

(22) Filed: Nov. 3, 2022

(65) Prior Publication Data

US 2023/0146741 A1  May 11, 2023

(30) Foreign Application Priority Data

Nov. 9, 2021 (KR) .................. 10-2021-0153440
May 11, 2022 (KR) .................. 10-2022-0058026

(51) Int. Cl.
*G06F 3/06* (2006.01)

(52) U.S. Cl.
CPC .......... *G06F 3/0613* (2013.01); *G06F 3/0629* (2013.01); *G06F 3/0679* (2013.01)

(58) Field of Classification Search
CPC .... G06F 3/0613; G06F 3/0629; G06F 3/0679; G11C 16/3459; G11C 16/10; G11C 16/12; G11C 16/24; G11C 5/147
See application file for complete search history.

(56) References Cited

U.S. PATENT DOCUMENTS

| 7,679,133 | B2 | 3/2010 | Son et al. |
| 7,911,843 | B2 | 3/2011 | Chun et al. |
| 8,432,734 | B2 | 4/2013 | Kim |

(Continued)

FOREIGN PATENT DOCUMENTS

KR      10-1596827 B1   2/2016

OTHER PUBLICATIONS

Extended European Search Report dated Mar. 16, 2023 for corresponding European Application No. 22205772.1.

*Primary Examiner* — Khoa D Doan
(74) *Attorney, Agent, or Firm* — Harness, Dickey & Pierce, P.L.C.

(57) ABSTRACT

A memory device for improving the speed of a program operation and an operating method thereof is provided. The memory device includes a memory cell array including a plurality of memory cells, a voltage generator configured to generate voltages for one or more program operations and a verify operation performed on the plurality of memory cells, a control logic configured to perform a control operation on the plurality of memory cells so that a first program and a second program loop are performed, a second program operation being performed based on a compensation voltage level determined based on a result of the first verify operation, and a plurality of bit lines connected to the memory cell array, wherein the first verify operation includes first even sensing and second even sensing on even-numbered bit lines, and first odd sensing and second odd sensing on odd-numbered bit lines.

18 Claims, 15 Drawing Sheets

(56) References Cited

U.S. PATENT DOCUMENTS

| | | |
|---|---|---|
| 8,495,283 B2 | 7/2013 | Park et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,675,415 B2 * | 3/2014 | Kim ........................ G11C 16/06 365/185.21 |
| 9,779,833 B2 | 10/2017 | Joo et al. |
| 10,839,907 B2 | 11/2020 | Tran et al. |
| 10,861,569 B1 | 12/2020 | Choi et al. |
| 11,004,525 B1 | 5/2021 | Gautam et al. |
| 2005/0083735 A1 | 4/2005 | Chen et al. |
| 2011/0090740 A1 * | 4/2011 | Lee ........................ G11C 16/26 365/185.03 |
| 2011/0233648 A1 | 9/2011 | Seol et al. |
| 2021/0098066 A1 | 4/2021 | Yang |

\* cited by examiner

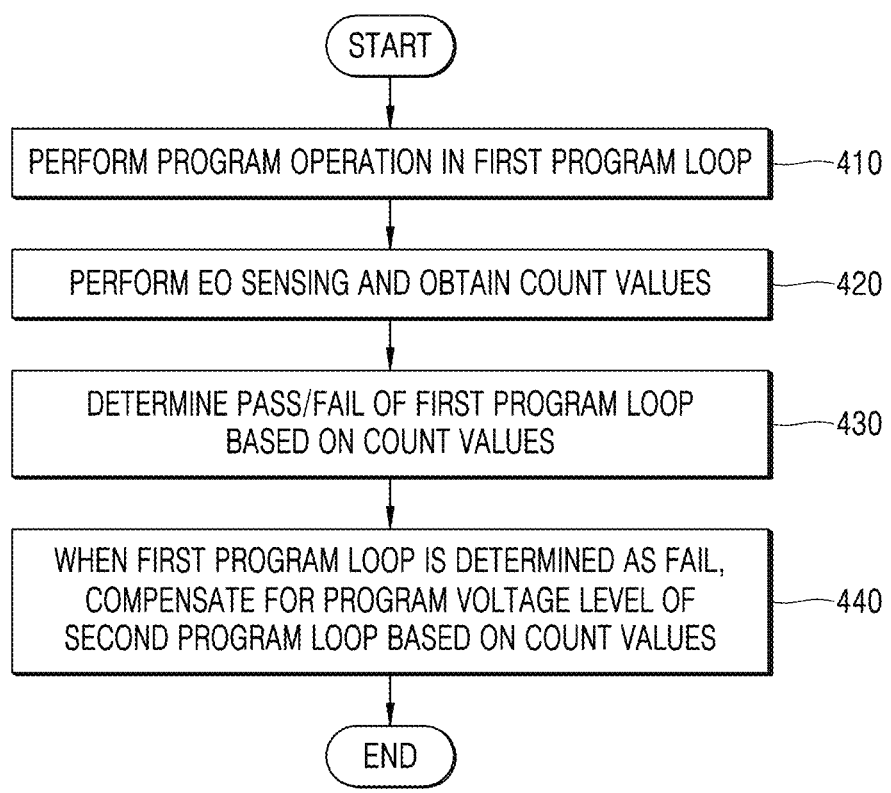

FIG. 8

| FIRST CONDITION | SECOND CONDITION | THIRD CONDITION | COMPENSATION OF PROGRAM VOLTAGE LEVEL |
|---|---|---|---|
| Y>X | X+Y>300bit | X < 90bit | 500(ISPP) + 0(Offset) [mV] |
| | | X > 90bit | 500(ISPP) + 50(Offset) [mV] |
| | X+Y>200bit | X < 60bit | 400(ISPP) + 0(Offset) [mV] |
| | | X > 60bit | 400(ISPP) + 50(Offset) [mV] |
| | X+Y>100bit | X < 30bit | 300(ISPP) + 0(Offset) [mV] |
| | | X > 30bit | 300(ISPP) + 50(Offset) [mV] |
| Y<X | Don't Care | Don't Care | ISPP Max + 600 [mV] |

MEMORY DEVICE FOR IMPROVING SPEED OF PROGRAM OPERATION AND OPERATING METHOD THEREOF

CROSS-REFERENCE TO RELATED APPLICATIONS

This application is based on and claims priority under 35 U.S.C. § 119 to Korean Patent Application No. 10-2021-0153440, filed on Nov. 9, 2021, in the Korean Intellectual Property Office, and Korean Patent Application 10-2022-0058026, May 11, 2022, in the Korean Intellectual Property Office, the disclosures of each of which are incorporated by reference herein in their entireties.

BACKGROUND

The inventive concepts relate to a memory device, and more particularly, to a memory device for improving the speed of a program operation and an operating method thereof.

A nonvolatile memory device includes a plurality of memory cells that store data even when power supply is cut off. For example, a flash memory device is a nonvolatile memory device that may be used in cell phones, digital cameras, portable digital assistants (PDAs), portable computer devices, stationary computer devices, and other devices.

When a program operation for writing data into the nonvolatile memory device is performed, an incremental step programming pulse (ISPP) that repeats the program operation while increasing a program voltage level by a certain value may be performed.

In this case, the program operation and a verify operation may be repeatedly performed for each program loop of the ISPP. A time required to write data may increase due to a program loop having a large number of repetitions, and an increase in the number of verify operations may significantly increase the time required to write the data.

SUMMARY

The inventive concepts provide a memory device and an operating method thereof through at least three times sensing.

According to an aspect of the inventive concepts, there is provided a memory device including a memory cell array. The memory cell array including a plurality of memory cells, a voltage generator configured to generate voltages for one or more program operations and a verify operation, the one or more program operations and the verify operation being performed on the plurality of memory cells, and a control logic configured to perform a control operation on the plurality of memory cells so that a first program loop and a second program loop are performed, the first program loop comprising a first program operation among the one or more program operations and a first verify operation, the second program loop comprising a second program operation among the one or more program operations, the second program operation being performed based on a compensation voltage level determined based on a result of the first verify operation, and a plurality of bit lines connected to the memory cell array, wherein the first verify operation includes first even sensing and second even sensing on even-numbered bit lines among the plurality of bit lines, and first odd sensing and second odd sensing on odd-numbered bit lines among the plurality of bit lines.

According to another aspect of the inventive concepts, there is provided a method of operating a memory device including performing a first program loop including a first program operation and a first verify operation on a plurality of memory cells, determining a compensation voltage level based on a result of the first verify operation, and performing a second program loop comprising a second program operation, the second program operation being performed based on the determined compensation voltage level, wherein the first verify operation includes first even sensing and second even sensing on even-numbered bit lines of the memory device, and first odd sensing and second odd sensing on odd-numbered bit lines of the memory device.

According to another aspect of the inventive concepts, there is provided a memory device including a memory cell array including a plurality of single level cells configured to store one bit per cell, a voltage generator configured to generate voltages for one or more program operation and a verify operation, the one or more program operations and the verify operation being performed on the memory cell array, and a control logic configured to perform a control operation on the memory cell array so that a first program loop, and a second program loop are performed, the first program loop comprising a first program operation among the one or more program operations, the second program loop comprising a second program operation among the one or more program operations, the second program operation being performed based on a compensation voltage level determined based on a result of the first verify operation, and a plurality of bit lines connected to the memory cell array, wherein the first verify operation comprises obtaining first count values based on a difference between a first even sensing and a second even sensing on an even-numbered bit line among the plurality of bit lines, obtaining a second count value based on a difference between a first odd sensing and a second odd sensing on an odd-numbered bit line among the plurality of bit lines, and determining whether the first count value and the second count value satisfy a plurality of pass conditions.

BRIEF DESCRIPTION OF THE DRAWINGS

Example embodiments of the inventive concepts will be more clearly understood from the following detailed description taken in conjunction with the accompanying drawings in which:

FIG. 4 is a flowchart illustrating an operating method of a memory device according to some example embodiments;

FIG. 8 is a table illustrating compensation of a program voltage level according to first to third conditions according to some example embodiments of the inventive concepts;

DETAILED DESCRIPTION OF THE EXAMPLE EMBODIMENTS

Hereinafter, some example embodiments of the inventive concepts will be described in detail with reference to the accompanying drawings.

Figure 1:
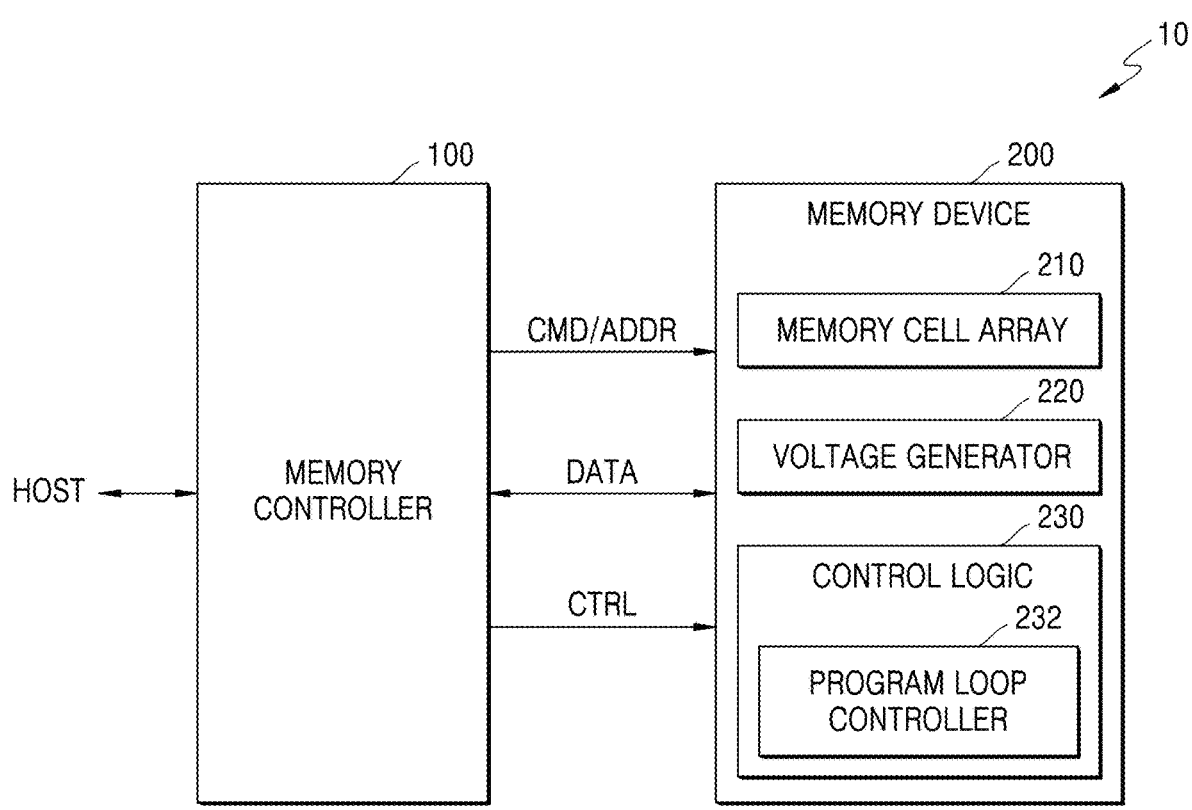
FIG. 1 is a block diagram illustrating a memory system according to some example embodiments.

FIG. 1 is a block diagram illustrating a memory system 10 according to some example embodiments.

Referring to FIG. 1, the memory system 10 may include a memory controller 100 and a memory device 200, and the memory device 200 may include a memory cell array 210, a voltage generator 220, and a control logic 230, and the control logic 230 may include a program loop controller 232.

In FIG. 1, the program loop controller 232 is illustrated as being provided in the control logic 230, but the program loop controller 232 according to some example embodiments may be implemented as a separate component outside the control logic 230. In addition, the program loop controller 232 may perform functions according to some example embodiments through various methods, and may be implemented as, for example, a hardware circuit, software executable by a processor, or a combination thereof.

According to some example embodiments, the memory device 200 may include a nonvolatile memory device. In some example embodiments, the memory system 10 may be implemented as a memory embedded in or removable from an electronic device. For example, the memory system 10 may be implemented in a variety of forms, such as an embedded Universal Flash Storage (UFS) memory device, an embedded Multi Media Card (eMMC), a Solid State Drive (SSD), a UFS memory card, a Compact Flash (CF) card, a Secure Digital (SD) card, a Micro Secure Digital (Micro-SD) card, a Mini Secure Digital (Mini-SD) card, an extreme Digital (xD) card, or a memory stick.

The memory controller 100 may control the memory device 200 to read data stored in the memory device 200 or write data to the memory device 200, in response to a write/read request from a host HOST. Specifically, the memory controller 100 may control write, read, and erase operations performed on the memory device 200 by providing an address ADDR, a command CMD, and a control signal CTRL to the memory device 200. Also, data DATA to be stored in the memory device 200 and data DATA read from the memory device 200 may be transmitted/received between the memory controller 100 and the memory device 200.

The memory cell array 210 may include a plurality of memory cells. For example, the plurality of memory cells may be flash memory cells. Hereinafter, example embodiments of the inventive concepts will be described with reference to a case in which the plurality of memory cells are NAND flash memory cells as an example. However, the inventive concepts are not limited thereto, and in some example embodiments, the plurality of memory cells may be resistive memory cells, such as resistive RAM (ReRAM), phase change RAM (PRAM), or magnetic RAM (MRAM).

In some example embodiments according to the inventive concepts, each memory cell included in the memory cell array 210 may correspond to a single level cell (SLC) that stores 1-bit data. However, the inventive concepts are not limited thereto, and in another example embodiment, the memory cell may store 2-bit or higher data. For example, the memory cell may correspond to a multi-level cell (MLC) that stores 2-bit data, may correspond to a triple-level cell (TLC) that stores 3-bit data, or may correspond to a quadruple level cell (QLC) that stores 4-bit data.

In some example embodiments, the memory cell array 210 may include a three-dimensional (3D) memory cell array. The 3D memory cell array may include a plurality of NAND strings. Each of the plurality of NAND strings may include memory cells respectively connected to word lines stacked vertically on a substrate. U.S. Pat. Nos. 7,679,133, 8,553,466, 8,654,587, 8,559,235, and U.S. Patent Application Publication No. 2011/0233648 disclose suitable configurations of a 3D memory cell array including a plurality of levels and sharing word lines and/or bit lines between the levels, which are incorporated herein by reference. However, the inventive concepts are not limited thereto, and in some example embodiments, the memory cell array 210 may include a two-dimensional (2D) memory cell array. The 2D memory cell array may include a plurality of NAND strings arranged in row and column directions.

As a write command to request data write from the memory controller 100 is provided to the memory device 200, a write operation may be performed based on the control of the control logic 230. The write operation may be performed through a plurality of program loops, and a period during which the plurality of program loops are performed may be referred to as a program cycle. That is, the operation of writing data into the memory cell may include a plurality of program loops within the program cycle, and a program operation using a program voltage and a verify operation using a verify voltage may be performed in any one program loop. In this regard, the memory controller 100 may perform the write operation according to incremental step pulse programming (ISPP). The ISPP increases a program voltage level by an ISPP voltage increment whenever a program loop is repeated. For example, a program voltage level of an (N+1)th program loop may be greater than a program voltage level of an Nth program loop. In some example embodiments of the inventive concepts, a program voltage level of a following program loop may be variably set based on a distribution shape of a threshold voltage of a preceding program loop.

The voltage generator 220 may generate various voltages used in the memory device 200, and may generate, for example, a program voltage (VP_N) provided to a selected word line and an inhibit voltage (VP_F) provided to an unselected word line for the program operation. Also, the voltage generator 220 may further generate a verify voltage (VV_M) used for a verify operation of verifying the program operation and an erase voltage (VV_P) provided to word lines during an erase operation. Also, although not shown in FIG. 2, the voltage generator 220 may further generate a string selection voltage and a ground selection voltage respectively provided to string selection lines and ground selection lines.

The control logic 230 may control the overall operation of the memory device 200, and, for example, may output various internal control signals for programming data to the memory cell array 210 or reading data from the memory cell array 210, based on the command CMD, the address ADDR, and the control signal CTRL received from the memory controller 100. Also, the control logic 230 may output a voltage control signal (not shown) for adjusting levels of various voltages output from the voltage generator 220 in connection with the program operation, the read operation, and the erase operation.

According to some example embodiments, the program loop controller 232 may control program loops performed to write data to the memory cell array 210. For example, the program loop controller 232 may control the number of times of program loops within a program cycle or adjust various voltage levels used in the program/verify operation for each program loop. For example, the program loop controller 232 may determine pass/fail for determining whether to perform the following program loop while the plurality of program loops are being performed or whether to end the following program loop without performing the following program loop because data write has been successfully completed. The program loop controller 232 may control performing of the following program loop to be bypassed or skipped according to a result of determining pass/fail of the preceding program loop. Alternatively, the program loop controller 232 may perform the following program loop while controlling only the program operation to be performed and the verify operation to be skipped, according to the result of determining pass/fail of the preceding program loop. In this regard, the voltage level of the program operation performed in the following program loop may vary based on count values obtained through the verify operation of the preceding program loop. The plurality of count values may be values capable of inferring a distribution shape of threshold voltages.

Figure 2:
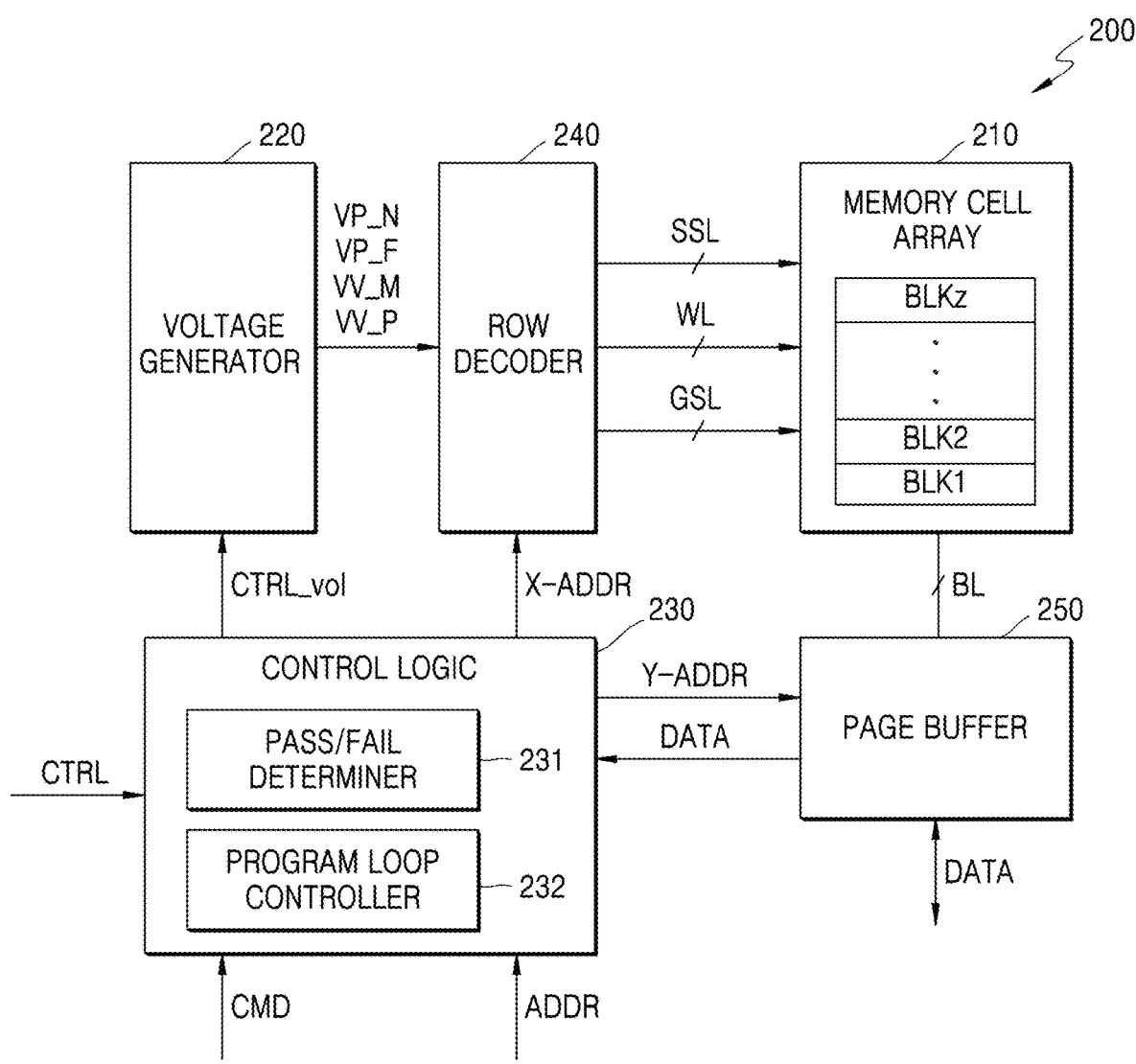
FIG. 2 is a block diagram of a memory device according to some example embodiments.

FIG. 2 is a block diagram of a memory device 200 according to some example embodiments.

Referring to FIGS. 1 and 2, the memory device 200 may include a memory cell array 210, a voltage generator 220, a control logic 230, a row decoder 240, and a page buffer 250. Although not shown in FIG. 2, the memory device 200 may further include various other components related to a memory operation, such as a data input/output circuit or an input/output interface.

According to some example embodiments, the memory cell array 210 may include a plurality of memory blocks BLK1 to BLKz, and may be connected to word lines WL, string selection lines SSL, ground selection lines GSL, and the bit lines BL. The memory cell array 210 may be connected to the row decoder 240 through the word lines WL, the string selection lines SSL, and the ground selection lines GSL, and may be connected the page buffer 250 through the bit lines BL. Each memory cell may store one or more bits, and may correspond to, for example, an SLC, a multi level cell (MLC), a triple level cell (TLC) or a quad level cell (QLC). In the following example embodiments, it is assumed that each memory cell corresponds to the SLC.

According to some example embodiments, the control logic 230 may output various internal control signals for programming data to the memory cell array 210 or reading data from the memory cell array 210, based on the command CMD, the address ADDR, and the control signal CTRL received from the memory controller 100. For example, the control logic 230 may provide a voltage control signal CTRL_vol to the voltage generator 220, and the voltage generator 220 may control levels of various voltages (including VP_N, VP_F, VV_M, and VV_P). In addition, in FIG. 2, the program loop controller 232 and the pass/fail determiner 231 are illustrated as configurations included in the control logic 230, but the inventive concepts are not limited thereto. According to various example embodiments, at least some of the elements constituting the program loop controller 232 and the pass/fail determiner 231 may be implemented outside the control logic 230.

According to some example embodiments, the control logic 230 may provide a row address X-ADDR to the row decoder 240 and a column address Y-ADDR to the page buffer 250. During the program operation, the row decoder 240 may provide a program voltage to a word line of a selected memory cell in response to the row address X-ADDR, and may provide an inhibit voltage to word lines of unselected memory cells.

According to some example embodiments, the memory device 200 may perform a program operation based on a two-step verification. For example, whenever a program loop is performed, a plurality of verify operations may be performed after the program operation is performed. As an example, a two-step verify operation may include a first verify operation using even odd (EO) sensing and a second verify operation using fine sensing. The verify voltages (e.g., a first voltage level and a second voltage level for sensing of even-numbered bit lines) of the first verify operation may have smaller values than values of the verify voltages (e.g., a voltage for fine sensing) of the second verify operation.

According to some example embodiments, with respect to the plurality of memory cells on which a program is performed, first memory cells having threshold voltages lower than a first voltage level, second memory cells having threshold voltages higher than the first voltage level and lower than the second voltage level, and third memory cells having threshold voltages higher than the second voltage level and lower than the third voltage level may be identified, respectively, through the first verify operation. In order to identify each of the first memory cells to the third memory cells, the first verify operation may be based on EO sensing. The EO sensing may include even sensing for sensing even-numbered bit lines and odd sensing for sensing odd-numbered bit lines. A specific description of the EO sensing will be described below.

The number of second memory cells may correspond to a first count value, and the number of third memory cells may correspond to a second count value. The second voltage level may be a higher voltage level than the first voltage level, and the third voltage level may be a higher voltage level than the second voltage level. With respect to the plurality of memory cells on which the program is performed, the memory cells having threshold voltages lower than a second threshold voltage may be identified through the second verify operation.

According to some example embodiments, a following program loop may be performed based on the first count value and the second count value. For example, the following program loop may be skipped or a voltage level of a program operation performed in the following program loop may vary depending on the first count value and the second count value. For example, when a plurality of pass conditions based on the first count value and the second count value are satisfied, it may be determined that the program for writing data is completed. That is, when the plurality of pass conditions are satisfied, the following program loop may be skipped.

According to some example embodiments, the pass/fail determiner 231 may receive the data through the page buffer 250 and determine pass/fail of the program according to whether a result of determining a state of the data DATA satisfies a plurality of pass conditions.

The plurality of pass conditions may include a first condition, a second condition, and a third condition. The first condition may be that the second count value exceeds the first count value. The first condition is to determine whether the verify voltage level is located on the left side or the right side of a distribution of threshold voltage. The second condition may be that a sum of the first count value and the second count value is less than a first threshold value. The second condition is to determine how narrow the distribution of the threshold voltage is. For example, as the optimal program operation is performed, the distribution of the threshold voltage may greatly converge to a target voltage level. Because the number of memory cells moving away from the target voltage level increases as the distribution of the threshold voltage deteriorates, it may be determined whether the number of memory cells moving away from the target voltage level is less than the first threshold value based on the second condition. The third condition may be that the first count value is less than a second threshold value. The third condition is to determine a degree of sagging of the distribution of the threshold voltage. Due to damage to an oxide layer caused by the repetition of a P/E cycle and thermal stress, the distribution of the threshold voltage may be widened. The third condition may be a condition for determining how wide the distribution of the threshold voltage is.

The program loop controller 232 may control the operation of program loops within a program cycle according to some example embodiments of the inventive concepts. According to some example embodiments, the program loop controller 232 may perform a control operation with respect to various environment settings, such as voltage levels related to program and verify operations in each program loop. For example, according to some example embodiments, when at least one of the first condition to the third condition is not satisfied, the following program loop may be performed, and the program loop controller 232 may vary the voltage level of the program operation in the following program loop. The varied voltage level of the program operation may be based on the first count value and the second count value. The varied voltage level of the program operation will be described below.

According to some example embodiments, the page buffer 250 may operate as a write driver or a sense amplifier according to an operation mode. The page buffer 250 may include a plurality of buffer units respectively connected to the plurality of bit lines BL. Each of the buffer units may include one or more latches storing read data through a bit line corresponding to the bit unit. The page buffer 250 may perform a bit line setup operation. For example, the page buffer 250 may set up bit lines at different levels with respect to a memory cell in which a program is inhibited, a memory cell in which the even sensing is to be performed, and a memory cell in which the odd sensing is to be performed. As an example of an operation, data read through a first even sensing operation and data read through a second even sensing operation of the first verify operation may be stored in the page buffer 250, and the number of memory cells which a threshold voltage is greater than the first voltage level and less than the second voltage level may be identified based on the data stored in the page buffer 250 and may be used in conditions for determining a pass by the pass/fail determiner 231.

Figure 3:
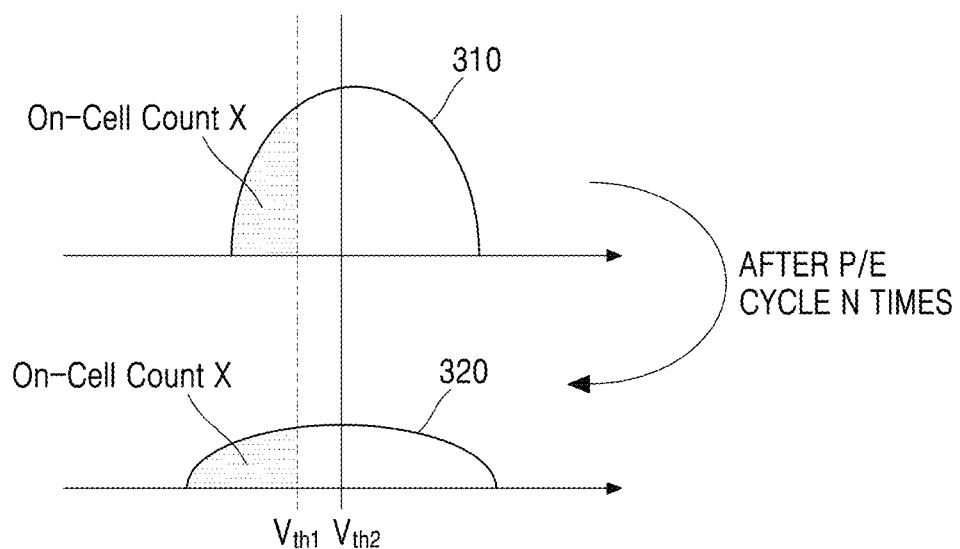
FIG. 3 is a diagram illustrating an example of a two-step verify operation when distribution sagging occurs according to a comparative example.

FIG. 3 is a diagram illustrating an example of a two-step verify operation when distribution sagging occurs according to a comparative example.

Referring to FIGS. 2 and 3, a plurality of program loops may be performed so that memory cells to which data is written have a threshold voltage that is greater than a second threshold voltage Vth2 according to a data value. In any one program loop, the two-step verify operation may be performed after a program operation is performed, and a verify operation may be performed with respect to a first threshold voltage Vth1 and the second threshold voltage Vth2, and thus a coarse on cell and a fine on cell may be discriminated from each other. The two-step verify operation may perform a read operation with respect to the first threshold voltage Vth1, which may be referred to as coarse sensing. Also, the two-step verify operation may perform a read operation with respect to the second threshold voltage Vth2, which may be referred to as fine sensing. Memory cells may have different threshold voltage change characteristics according to performing of program, and even if the memory cells undergo the same number of program loops according to the same program voltage level, some slow cells may have lower threshold voltage levels than those of other cells, and accordingly, the coarse on cell and the fine on cell may simultaneously exist in the memory cell array 210. For example, when the threshold voltages are formed along a first distribution 310, the number of coarse on cells may be x.

According to some example embodiments, as a plurality of P/E cycles are performed, the first distribution 310 may be changed to a second distribution 320. That is, when a program operation and an erase operation are repeatedly performed on the same memory cell, as described above, distribution sagging of a threshold voltage may occur due to deterioration caused by electronics accumulated in an oxide layer and thermal stress. The second distribution 320 may correspond to a distribution changed after the deterioration of the first distribution 310. In this regard, the number of coarse on cells may be identified again by performing the verify operation on the memory cells having the second distribution 320 with respect to the first threshold voltage Vth1 and the second threshold voltage Vth2, and, the number of coarse on cells may be x. That is, although a distribution shape of the threshold voltages with respect to the memory cells is changed from the first distribution 310 to the second distribution 320 due to distribution sagging, the number of coarse on cells may be the same. That is, when the two-step verify operation according to the related art is used, only the number of coarse on cells may be identified, and specifically, a change (e.g., distribution sagging) in the distribution shape may not be identified. Because the program operation is performed by increasing the voltage level of the program operation only by a previously determined increment according to the number of coarse on cells in the following program loop, the number of repetitions of the program loop performed until data write is completed is increased, and the time required to write data increases.

FIG. 4 is a flowchart illustrating an operating method of the memory device 200 according to some example embodiments.

Referring to FIG. 4, in operation 410, the memory device 200 may perform a first program operation in a first program loop $1^{st}$ Loop. The first program operation PGM may be performed in the first program loop $1^{st}$ Loop by applying a first program voltage $V_{PGM1}$. After the first program operation is completed, the memory device 200 may apply verify voltages and perform a verify operation VFY. For example, the verify operation may correspond to a two-step verify operation including EO sensing and fine sensing.

In operation 420, the memory device 200 may perform EO sensing and obtain count values CNT. The EO sensing may include even sensing for sensing even-numbered bit lines at least twice and odd sensing for sensing odd-numbered bit lines at least twice. The memory device 200 may perform the EO sensing and obtain a first count value and a second count value. The first count value may be the number of second memory cells having threshold voltages higher than a first voltage level and lower than a second voltage level, and the second count value may be the number of third memory cells having threshold voltages higher than the second voltage level and lower than a third voltage level.

In operation 430, the memory device 200 may determine pass/fail of the first program loop $1^{st}$ Loop based on the count values. The memory device 200 may determine whether all of plurality of pass conditions are satisfied using the pass/fail determiner 231. For example, the pass/fail determiner 231 may determine whether a first condition in which the second count value exceeds the first count value is satisfied. The pass/fail determiner 231 may determine whether a value obtained by subtracting the first count value from the second count value exceeds 0.

In another example, the pass/fail determiner 231 may check a second condition that the sum of the first count value and the second count value is less than a first threshold value. The first threshold value may be, for example, 100 bits, but is not limited thereto. According to various example embodiments, the memory device 200 may variably set the first threshold value based on the number of P/E cycles.

In another example, the memory device 200 may check a third condition that the first count value is less than a first threshold value. The second threshold value may be, for example, 30 bits, but is not limited thereto. According to various example embodiments, the memory device 200 may variably set the second threshold value based on the number of P/E cycles.

According to some example embodiments, when all of the first condition, the second condition, and the third condition are satisfied, the memory device 200 may determine the first program loop $1^{st}$ Loop as a pass. When determining the first program loop $1^{st}$ Loop as a pass, the memory device 200 may determine that data write is completed and end the operation. When at least one of the first condition, the second condition, and the third condition is not satisfied, the memory device 200 may determine to perform a following second program loop $2^{nd}$ Loop. In this regard, the memory device 200 may variably set a program voltage level of a second program loop $2^{nd}$ Loop based on the first count value and the second count value.

In operation 440, when the first program loop $1^{st}$ Loop is determined as a fail, the memory device 200 may compensate for the program voltage level of the second program loop $2^{nd}$ Loop based on the count values. For example, the pass/fail determiner 231 may identify that the first condition is not satisfied in the plurality of memory cells. When the first condition is not satisfied, it means that the memory cells are not programmed to such an extent that a verify voltage level is to the right side of a distribution of the threshold voltage. Accordingly, in order to shift the distribution of the threshold voltage to the right as much as possible, the compensation of the program voltage level for the second program loop $2^{nd}$ Loop may be set to the maximum (e.g., increased). For example, the program loop controller 232 may set an ISPP increment to the maximum ISPP Max and add the maximum offset voltage. For example, the maximum offset voltage value may be 600 mV.

Although the first condition is satisfied, at least one of the second condition and the third condition may not be established. For example, the sum of the first count value and the second count value may exceed the first threshold value (when the second condition is not established), and the first count value may exceed the second threshold value (when the third condition is not established). In this regard, the program loop controller 232 of the memory device 200 may variously set the size of the voltage increment for the second program loop $2^{nd}$ Loop according to how much the sum of the first count value and the second count value exceeds the first threshold value, and how much the first count value exceeds the second count value. A specific description of the voltage increment that may be variously set will be described below. For example, the program loop controller 232 may variably set a level of the ISPP voltage increment based on the second condition, and determine whether to add an offset voltage value to the ISPP voltage increment based on the third condition. That is, the compensation of the program voltage level of the second program loop $2^{nd}$ Loop may be variably set according to the level of the ISPP voltage increment and the presence or absence of the offset voltage value.

Figure 5A:
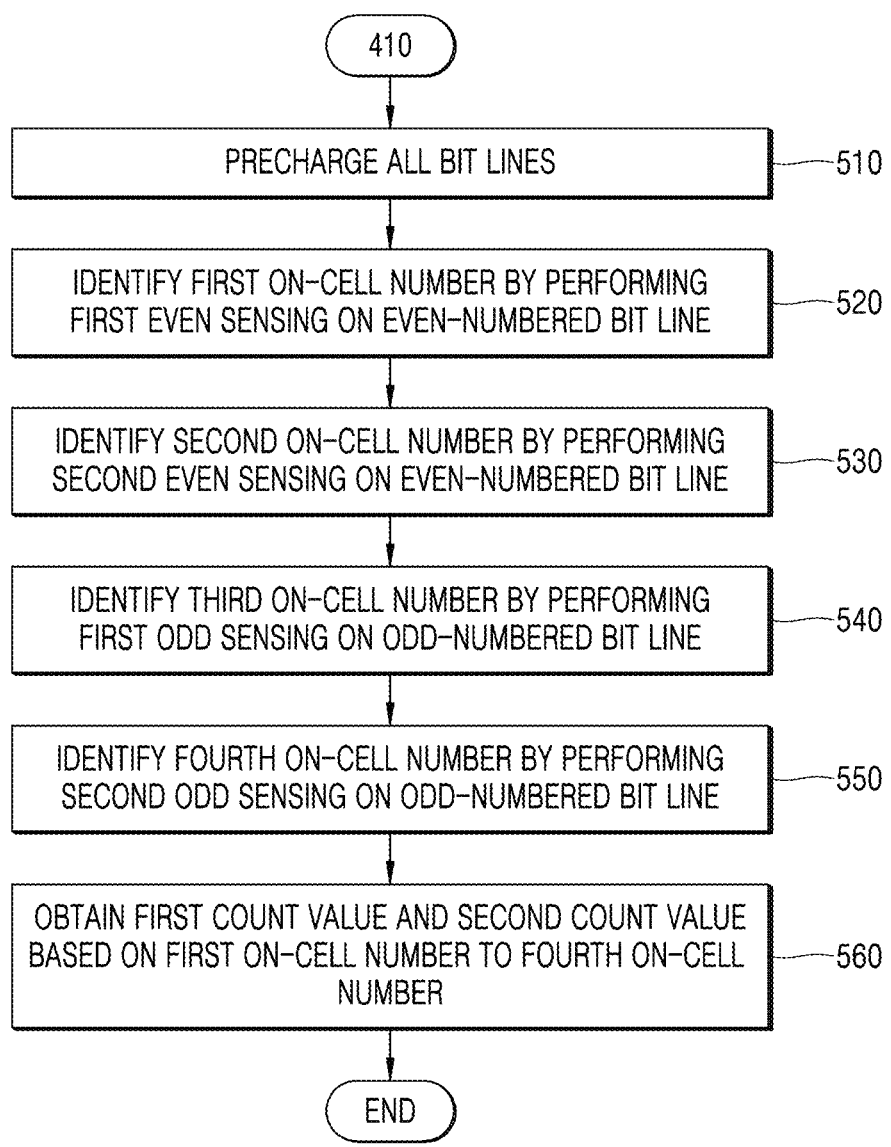
FIG. 5A is a flowchart illustrating an operating method of even odd (EO) sensing according to some example embodiments.
Figure 5B:
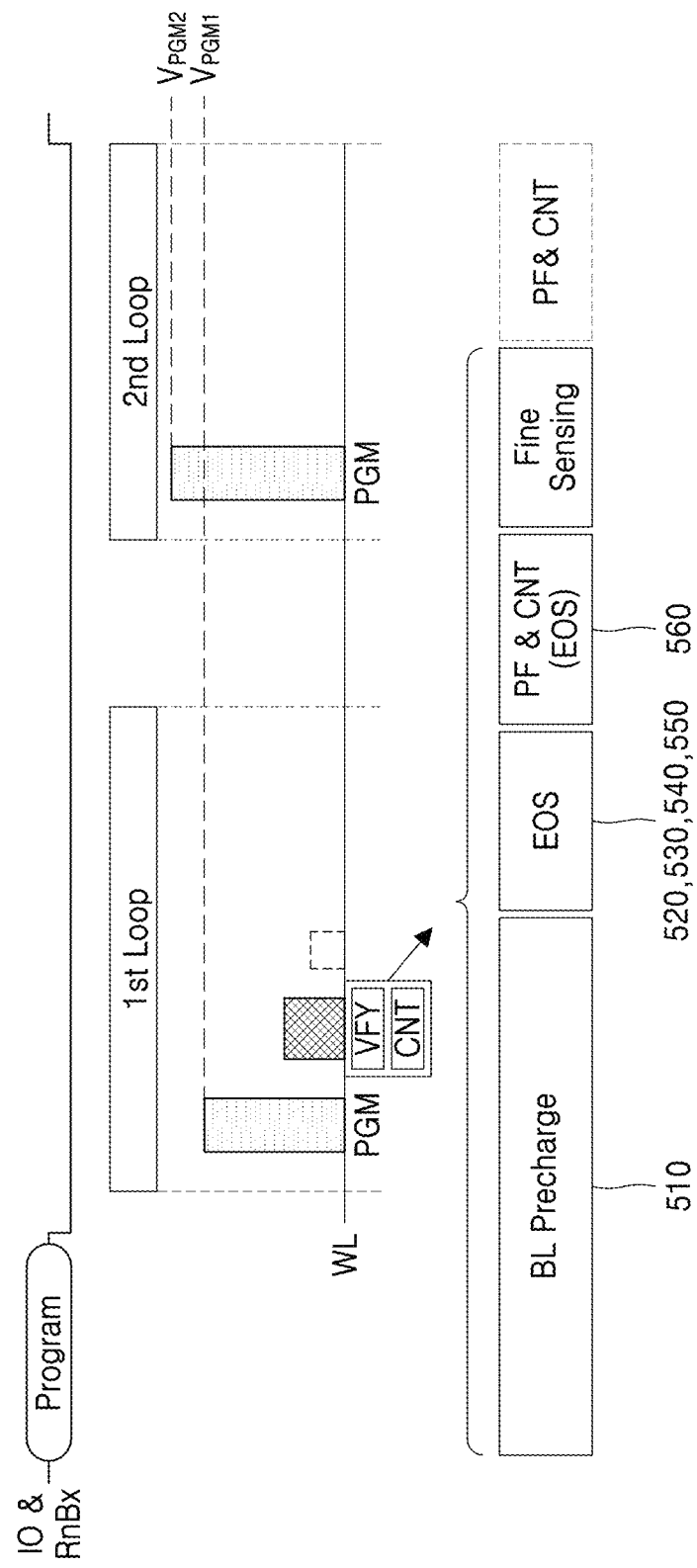
FIG. 5B illustrates a time flow of EO sensing according to some example embodiments.

FIG. 5A is a flowchart illustrating an operating method of EO sensing according to some example embodiments, and FIG. 5B illustrates a time flow of EO sensing according to some example embodiments.

Referring to FIG. 5A, in operation 510, the memory device 200 may precharge a bit line. In this case, the precharged bit line may be all bit lines including both an odd-numbered and even-numbered bit lines. Thereafter, the memory device 200 may perform sensing at least twice by differently setting a sensing time during a development period with respect to some (e.g., the even-numbered and the odd-numbered bit lines) of the bit lines.

In operation 520, the memory device 200 may identify a first on-cell number by performing first even sensing on the even-numbered bit line. The first on-cell number may be the same as the number of memory cells having threshold voltages lower than the first voltage level. The first voltage level may be lower than a second voltage level based on second even sensing because first even sensing is performed first in the development period performed after the precharge.

In operation 530, the memory device 200 may identify a second on-cell number by performing second even sensing on the even-numbered bit line. The second on-cell number may be the same as the number of memory cells having threshold voltages lower than the second voltage level. Because second even sensing follows first even sensing, the second voltage level of second even sensing may be higher than the first voltage level of first even sensing.

In operation 540, the memory device 200 may identify a third on-cell number by performing first odd sensing on the odd-numbered bit line. The memory device 200 may perform first odd sensing in response to completion of second even sensing in operation 530. For example, first odd sensing and second even sensing may be performed at substantially the same time. Because first odd sensing and second even sensing are performed at the same time, the voltage level of first odd sensing may correspond to the second voltage level. The third on-cell number may be the same as the number of memory cells having threshold voltages lower than the second voltage level.

In operation 550, the memory device 200 may identify a fourth on-cell number by performing second odd sensing on the odd-numbered bit line. The fourth on-cell number may be the same as the number of memory cells having threshold voltages lower than the third voltage level. Because second odd sensing follows first odd sensing, the third voltage level of second odd sensing may be higher than the second voltage level of first odd sensing.

In operation 560, the memory device 200 may obtain a first count value and a second count value based on the first on-cell number to the fourth on-cell number. For example, the memory device 200 may determine, as the first count value, a value obtained by subtracting the first on-cell number from the second on-cell number. That is, the first count value may be the same as the number of memory cells having threshold voltages higher than the first voltage level and lower than the second voltage level. For example, the memory device 200 may determine, as the second count value, a value obtained by subtracting the third on-cell number from the fourth on-cell number. That is, the second count value may be the same as the number of memory cells having threshold voltages higher than the second voltage level and lower than the third voltage level.

Referring to FIG. 5B together, the memory device 200 may perform fine sensing after obtaining the first count value and the second count value. Fine sensing may be used to distinguish memory cells between the second voltage level and the third voltage level from other cells so as to increase a bit line level of the memory cells. According to some example embodiments, after performing coarse sensing and fine sensing through the existing two-step verify operation, the number of coarse on cells is counted and pass/fail of a program loop is determined (PF & CNT), but counting of the number of coarse on cells and determination of pass/fail may be omitted. According to some example embodiments, when coarse sensing is changed to EO sensing, because the first count value and the second count value are identified after EO sensing, the counting of the number of coarse on cells and the determination of pass/fail may be omitted.

Figure 6A:
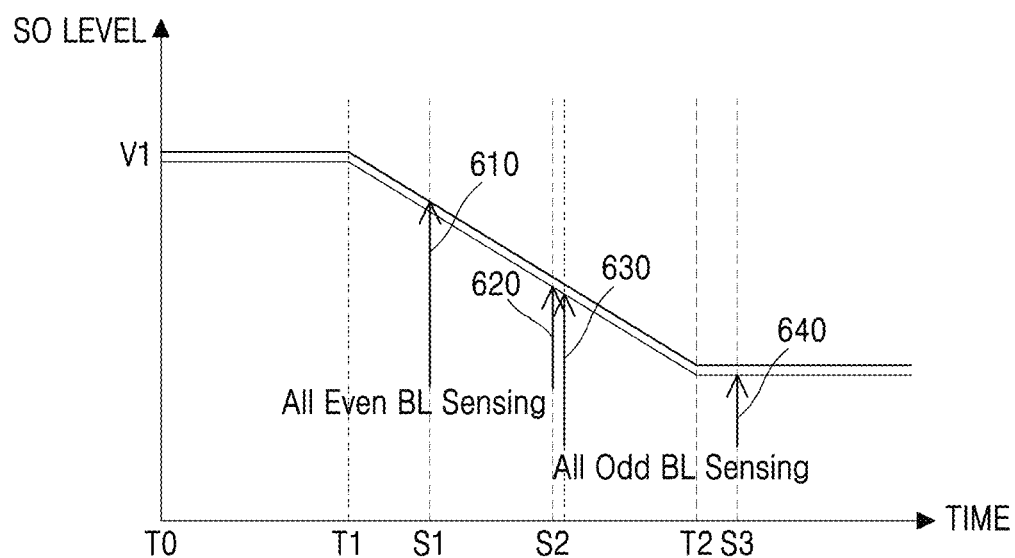
FIG. 6A is a graph illustrating a sensing time of EO sensing according to some example embodiments.
Figure 6B:
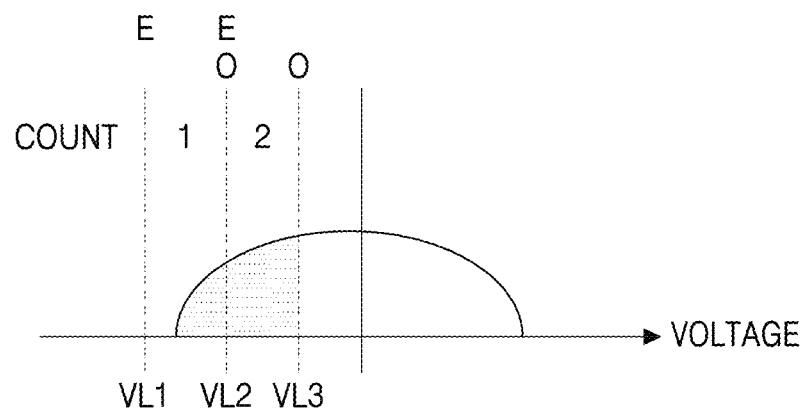
FIG. 6B is a graph illustrating a voltage level of EO sensing according to some example embodiments.

FIG. 6A is a graph illustrating a sensing time of EO sensing according to some example embodiments, and FIG. 6B is a graph illustrating a voltage level of EO sensing according to some example embodiments.

Referring to FIGS. 6A and 6B, a period from times T0 to T1 may be referred to as a precharge period, a period from times T1 to T2 may be referred to as a development period, and a period after the time T2 may be referred to as a latch period. According to some example embodiments, sensing may be performed by setting sensing times to S1, S2, and S3 times and latching a state of a sensing node by a logical value. First even sensing may be performed at the sensing time S1. First even sensing (E) may be first performed on an even-numbered bit line. A voltage level of first even sensing may correspond to a first voltage level VL1.

According to some example embodiments, second even sensing and first odd sensing (O) may be performed at the sensing time S2. A time at which second even sensing is performed does not exactly coincide with a time at which first odd sensing is performed, but second even sensing and first odd sensing may be performed at substantially the same time. The memory device 200 may obtain a first count value based on a difference between first even sensing and second even sensing performed on the even-numbered bit line. Accordingly, voltage levels of second even sensing and first odd sensing may also be substantially the same. For example, the voltage levels of second even sensing and first odd sensing may correspond to a second voltage level VL2. The first count value may be the number of memory cells having a threshold voltage between the first voltage level VL1 and the second voltage level VL2.

According to some example embodiments, second odd sensing may be performed at the sensing time S3 of the latch period. A voltage level of second odd sensing may correspond to a third voltage level VL3. The memory device 200 may obtain a second count value based on a difference between first odd sensing and second odd sensing performed on an odd-numbered bit line. The second count value may be the number of memory cells having a threshold voltage between the second voltage level VL2 and the third voltage level VL3.

In the above-described example embodiment, it has been described that even sensing is preceded on even-numbered bit lines and odd sensing is followed on odd-numbered bit lines, but the inventive concepts are not limited thereto. According to various example embodiments, the memory device 200 may first sense odd-numbered bit lines and then sense even-numbered bit lines.

Figure 7:
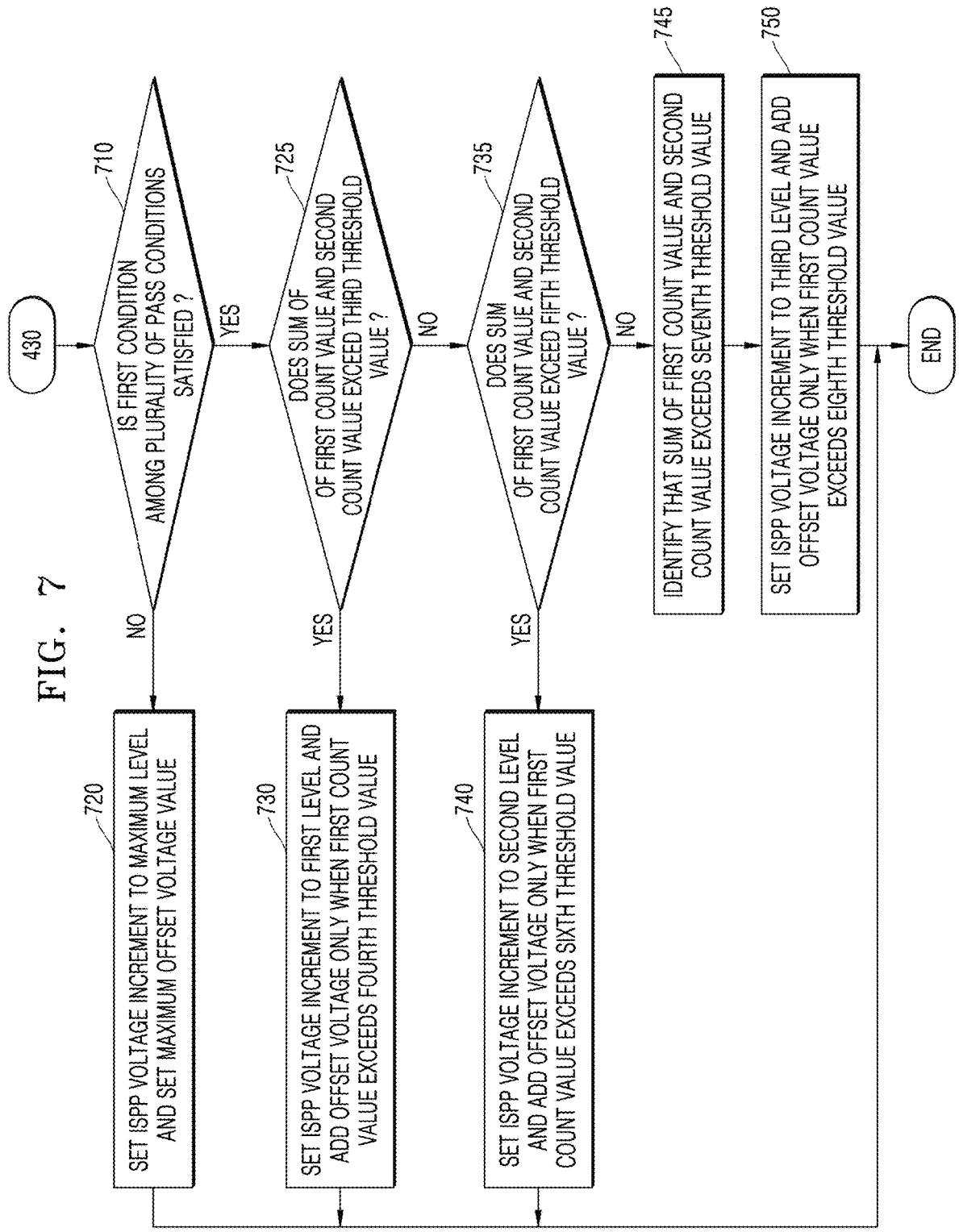
FIG. 7 is a flowchart illustrating an operating method of the memory device to determine compensation of a program voltage level according to some example embodiments of the inventive concepts.

FIG. 7 is a flowchart illustrating an operating method of the memory device 200 to determine compensation of a program voltage level according to some example embodiments of the inventive concepts.

Referring to FIG. 7, in operation 710, the memory device 200 may determine whether a first condition among a plurality of pass conditions is satisfied. The first condition may be that a first count value is less than a second count value. When the first condition is not satisfied, it may mean that a voltage level of EO sensing is not programmed enough to be on the right side of a distribution of a threshold voltage. When the first condition is satisfied, it may mean that the voltage level of EO sensing is on the left side of the distribution of the threshold voltage, and that a program is completed by repeating a program loop a small number of times.

In operation 720, the memory device 200 may set an ISPP voltage increment to the maximum level (e.g., increase the ISPP voltage increment) and set the maximum offset voltage value (e.g., increase the offset voltage value). Because the first condition among the plurality of pass conditions is not satisfied in operation 710, the memory device 200 may need to set a program voltage level of the second program loop $2^{nd}$ Loop to the maximum (e.g., increase the voltage level of the second program loop $2^{nd}$ Loop). To this end, the memory device 200 may set two setting values constituting the program voltage level of the second program loop $2^{nd}$ Loop to the maximum (e.g., increase the two setting values constituting the program voltage level of the second program loop $2^{nd}$ loop). The memory device 200 may set the maximum level among ISPP voltage increment levels (e.g., increase the ISPP voltage increment level). The memory device 200 may additionally add the maximum offset voltage value to the ISPP voltage increment set to the maximum level (e.g., increase the offset voltage value to the ISPP voltage increment). For example, the maximum offset value may be 600 mV.

In operation 725, the memory device 200 may determine whether the sum of the first count value and the second count value exceeds a third threshold value. In response to determining that the first condition is satisfied in operation 710, the memory device 200 may determine the level of the ISPP voltage increment based on a second condition. For example, the memory device 200 may determine the level of the ISPP voltage increment by comparing the sum of the first count value and the second count value with a third threshold value, a fifth threshold value, and a seventh threshold value. As described below, the third threshold value may be greater than the fifth threshold value, and the fifth threshold value may be greater than the seventh threshold value. As the first count value and the second count value decrease, a distribution shape of the threshold voltage may be closer to an impulse. That is, the higher the sum of the first count value and the second count value, the higher the level of the ISPP voltage increment may be set to narrowly change the distribution of the threshold voltage.

In operation 730, the memory device 200 may set the ISPP voltage increment to a first level and add an offset voltage only when the first count value exceeds a fourth threshold value. Because the sum of the first count value and the second count value exceeds the third threshold value, the memory device 200 may identify that the distribution of the current threshold voltage is not narrow. Accordingly, in order to narrow the distribution of the threshold voltage, the memory device 200 may set the level of the ISPP voltage increment to the first level. For example, the first level may be 500 mV. Additionally, the memory device 200 may add the offset voltage according to a comparison result of the first count value and the fourth threshold value. The comparison between the first count value and the fourth threshold value may be the same as a third condition for determining sagging of the distribution of the threshold voltage. When the first count value exceeds the fourth threshold value, the memory device 200 may identify an increase in the number of second memory cells having a threshold voltage higher than the first voltage level and lower than the second voltage level as the distribution sags. Accordingly, the memory device 200 may add the offset voltage to narrow the distribution of the threshold voltage by correcting sagging of the distribution.

In operation 735, the memory device 200 may determine whether the sum of the first count value and the second count value exceeds the fifth threshold value. The fifth threshold value may be less than the third threshold value. That is, the memory device 200 may determine whether the sum of the first count value and the second count value is less than the third threshold value but greater than the fifth threshold value.

In operation 740, the memory device 200 may set the ISPP voltage increment to a second level and add the offset voltage only when the first count value exceeds the sixth threshold value. The memory device 200 may determine that the distribution is narrower than when the sum of the first count value and the second count value exceeds the third threshold value, but the distribution is still wide considering data reliability. Accordingly, the memory device 200 may set the ISPP voltage increment to the second level. In this regard, the second level may be lower than the first level. For example, the second level may be 400 mV. Additionally, the memory device 200 may add the offset voltage according to a comparison result of the first count value and the sixth threshold value. Sagging of the distribution is less than when the first count value exceeds the fourth threshold value, but sagging of the distribution still exists, and thus, the memory device 200 may determine to add the offset voltage.

In operation 745, the memory device 200 may identify that the sum of the first count value and the second count value exceeds the seventh threshold value. The seventh threshold value may be less than the fifth threshold value. That is, the memory device 200 may determine whether the sum of the first count value and the second count value is less than the fifth threshold value but greater than the seventh threshold value.

In operation 750, the memory device 200 may set the ISPP voltage increment to the third level and add the offset voltage only when the first count value exceeds an eighth threshold value. The memory device 200 may determine that the distribution is narrower than when the sum of the first count value and the second count value exceeds the fifth threshold value, but the distribution is still wide considering data reliability. Accordingly, the memory device 200 may set the ISPP voltage increment to the third level. In this regard, the third level may be lower than the second level. For example, the second level may be 300 mV. Additionally, the memory device 200 may add an offset voltage according to a comparison result of the first count value and the eighth threshold value. Sagging of the distribution is less than when the first count value exceeds the sixth threshold value, but sagging of the distribution still exists, and thus, the memory device 200 may determine to add the offset voltage.

FIG. 8 is a table illustrating compensation of a program voltage level according to first to third conditions according to some example embodiments of the inventive concepts.

Referring to FIG. 8, the memory device 200 may identify whether a first count value X exceeds a second count value Y according to the first condition. When the first count value X exceeds the second count value Y (Y<X), the memory device 200 may not determine the second condition and the third condition, set an ISPP voltage increment to a maximum level ISPP Max (e.g., increase the ISPP voltage increment level), and add a maximum offset voltage (600 mV) (e.g., increase the offset voltage).

When the first condition is satisfied, the memory device 200 may determine a level of the ISPP voltage increment according to the second condition. For example, when the sum of the first count value X and the second count value Y exceeds 300 bits, a value of the ISPP voltage increment may be 500 mV of the first level. When the sum of the first count value X and the second count value Y exceeds 200 bits, the value of the ISPP voltage increment may be 400 mV of the second level. When the sum of the first count value X and the second count value Y exceeds 100 bits, the value of the ISPP voltage increment may be 300 mV of the third level.

When the first condition is satisfied, the memory device 200 may determine whether to add an offset voltage according to the third condition. For example, when the sum of the first count value X and the second count value Y exceeds 300 bits, the memory device 200 may compare the first count value X with 90 bits. When the first count value X exceeds 90 bits, the memory device 200 may add 50 mV of the offset voltage. When the first count value X does not exceed 90 bits, the memory device 200 may not add the offset voltage.

When the sum of the first count value X and the second count value Y is between 200 bits and 300 bits, a threshold value for comparison with the first count value X may be changed to 60 bits. This is because, the distribution of threshold voltage is narrower than when the second condition exceeds 300 bits, the maximum value that the first count value X may have is also reduced. For example, when the first count value X exceeds 60 bits, the memory device 200 may add 50 mV of the offset voltage. When the first count value X does not exceed 60 bits, the memory device 200 may not add the offset voltage.

When the sum of the first count value X and the second count value Y is between 100 bits and 200 bits, the threshold value for comparison with the first count value X may be changed to 30 bits. This is because, the distribution of threshold voltage is narrower than when the second condition is 200 bits and 300 bits, the maximum value that the first count value X may also be reduced. For example, when the first count value X exceeds 30 bits, the memory device 200 may add 50 mV of the offset voltage. When the first count value X does not exceed 30 bits, the memory device 200 may not add the offset voltage.

Figure 9:
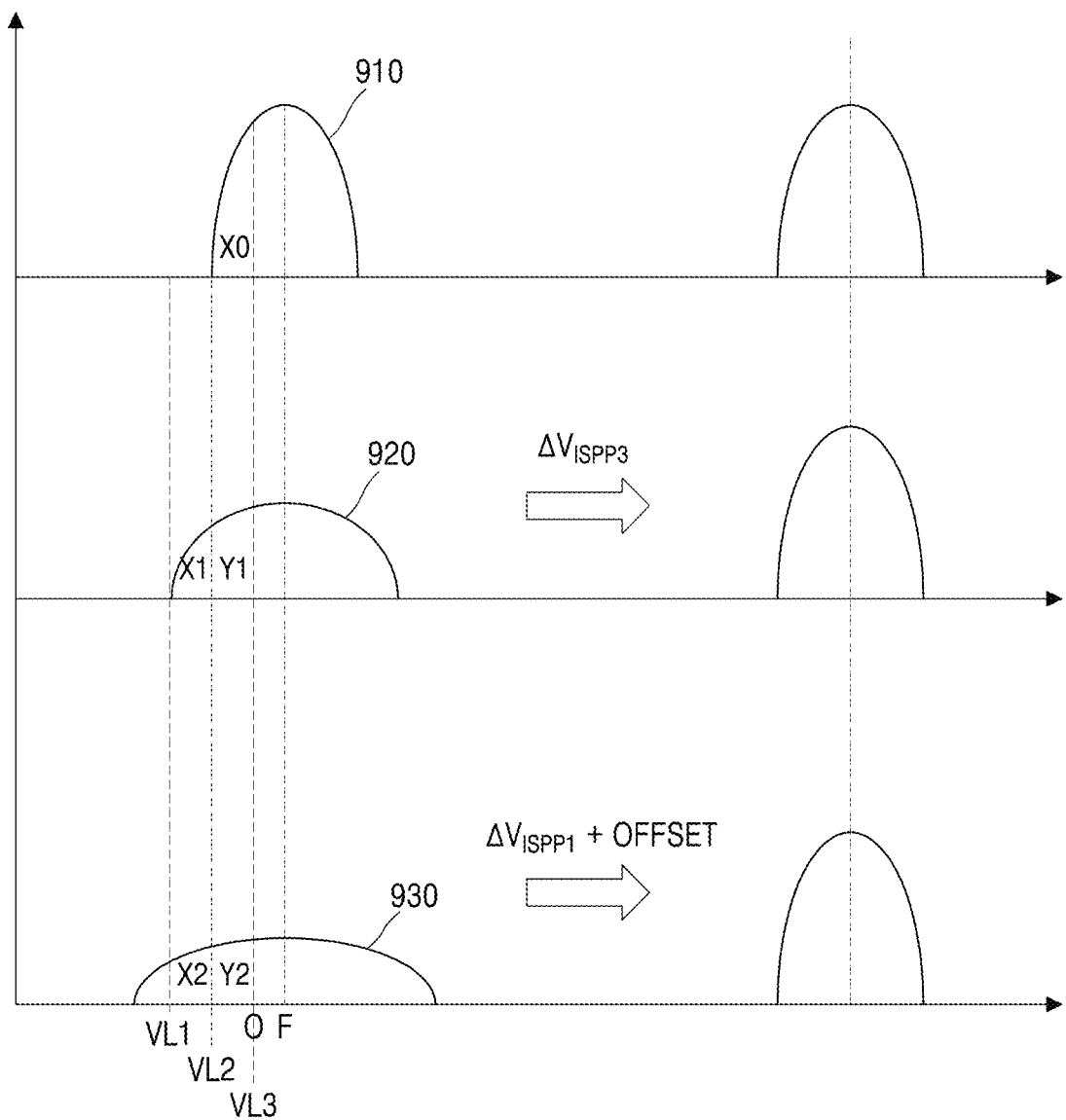
FIG. 9 illustrates an example of applying a compensated program voltage level according to some example embodiments of the inventive concepts.

FIG. 9 illustrates an example of applying a compensated program voltage level according to some example embodiments of the inventive concepts.

Referring to FIG. 9, a first distribution 910 to a third distribution 930 are illustrated. As the number of times P/E cycles increases, deterioration may occur from the first distribution 910 to the third distribution 930. That is, in the first distribution 910, the number of coarse on-cells based on coarse sensing of the related art may be X0. In this regard, X0 may be a low enough value to be determined as pass in a two-step verify operation.

A first count value of the second distribution 920 may be X1, and a second count value thereof may be Y1. That is, the number of memory cells having a threshold voltage higher than the first voltage level VL1 and lower than the second voltage level VL2 may be X1, and the number of memory cells having a threshold voltage higher than the second voltage level VL2 and lower than the third voltage level may be Y1. According to some example embodiments, X0 and the sum of X1, and Y1 may be the same. Accordingly, according to the two-step verify operation of the related art, the number of coarse on cells may also be equal to X0, which is the sum of X1 and Y1, and be determined as pass so that a program operation may end. However, because a distribution of threshold voltage is substantially wide, an error may occur when reading data. For example, when the sum of X1 and Y1 is 100 bits to 200 bits, and X1 is less than 30 bits, the memory device 200 according to some example embodiments may set a level of the ISPP voltage increment with respect to the second distribution 920 to a third level $\Delta V_{ISPP3}$ and perform the second program loop $2^{nd}$ Loop.

A first count value of the third distribution 930 may be X2, and a second count value thereof may be Y2. That is, the number of memory cells having a threshold voltage higher than the first voltage level VL1 and lower than the second voltage level VL2 may be X2, and the number of memory cells having a threshold voltage higher than the second voltage level VL2 and lower than the third voltage level VL3 may be Y2. According to some example embodiments, X0 and the sum of X2, and Y2 may be the same. Accordingly, according to the two-step verify operation of the related art, the number of coarse on cells may also be equal to X0, which is the sum of X2 and Y2, and be determined as pass so that the program operation PGM may end. However, because the distribution of the threshold voltage is substantially wide, an error may occur when reading data. For example, when the sum of X2 and Y2 exceeds 300 bits and X2 is greater than 90 bits, the memory device 200 according to some example embodiments may set the level of the ISPP voltage increment with respect to the second distribution 920 to a first level $\Delta V_{ISPP1}$, add an offset voltage +OFFSET, and perform the second program loop $2^{nd}$ Loop.

Figure 10A:
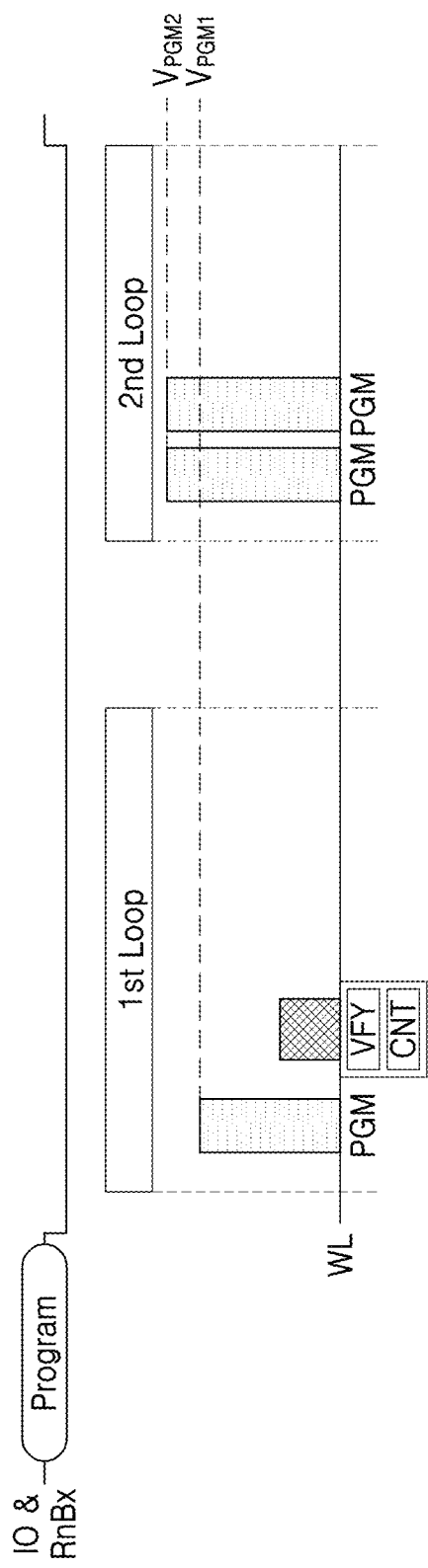
FIG. 10A illustrates another example of compensating for a second program loop according to some example embodiments of the inventive concepts.
Figure 10B:
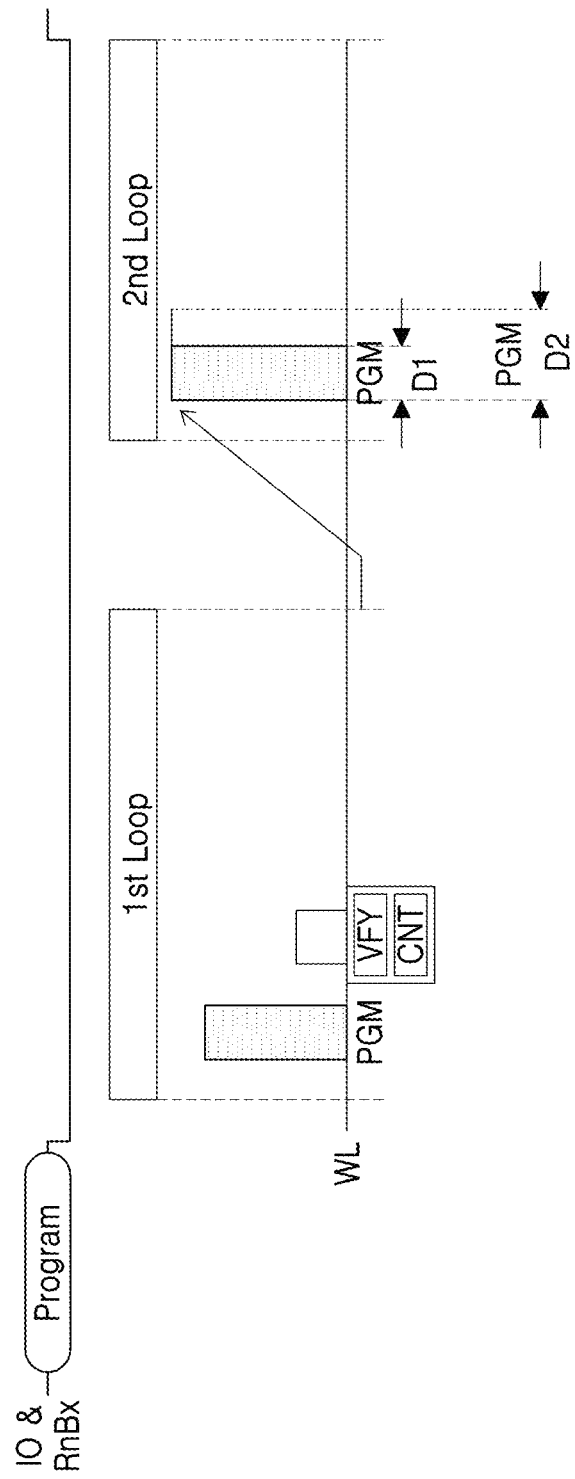
FIG. 10B illustrates another example of compensating for a second program loop according to some example embodiments of the inventive concepts.

FIGS. 10A and 10B illustrate other examples of compensating for the second program loop $2^{nd}$ Loop according to some example embodiments of the inventive concepts.

Referring to FIG. 10A, the memory device 200 may control a program operation PGM of the second program loop $2^{nd}$ Loop to be performed twice. For example, referring to FIG. 9 together, the memory device 200 may identify that threshold voltages of the memory cells follow the second distribution 920, set the level of the ISPP voltage increment to the third level $\Delta V_{ISPP3}$, and continuously apply a program pulse of the set voltage level twice. In another example, referring to FIG. 9 together, the memory device 200 may identify that the threshold voltages of the memory cells follow the third distribution 930, set the level of the ISPP voltage increment to the first level $\Delta V_{ISPP1}$, add the offset voltage +OFFSET, set the voltage level of the program operation of the second program loop $2^{nd}$ Loop, and continuously apply the program pulse of the set voltage level twice.

According to various example embodiments, in order to prevent or hinder an over program from occurring by continuously applying the program pulse twice, the memory device 200 may continuously apply a program pulse of a voltage level smaller than the compensation value of the program operation voltage level determined in the table of FIG. 8, based on the first count value and the second count value. For example, it may be assumed that the first count value X is 100 bits and the second count value Y is 210 bits. Referring to FIG. 8 together, because 'X+Y' exceeds 300 bits and 'X' exceeds 90 bits, the compensation value of the program voltage level of the second program loop $2^{nd}$ Loop may correspond to 550 mV. In order to prevent or hinder over program from occurring, the memory device 200 may repeatedly apply the program pulse twice at the voltage level of 500 mV excluding the offset voltage, reduce the level of the ISPP voltage increment while maintaining the offset voltage, and apply the program pulse at the voltage level of 450 mV.

In the above-described example embodiment, the voltage levels of the program operations performed twice in the second program loop $2^{nd}$ Loop are illustrated as being the same, but the inventive concepts are not limited thereto. According to various example embodiments, the over program may be caused by continuously applying the program pulse twice. Accordingly, the memory device 200 may set a voltage level of a following program pulse to be lower than a voltage level of a preceding program pulse in the second program loop $2^{nd}$ Loop.

Referring to FIG. 10B, the memory device 200 may increase the width of the program pulse applied in the second program loop $2^{nd}$ Loop. For example, referring to FIG. 9, the memory device 200 may identify that the threshold voltages of the memory cells follow the second distribution 920, set the level of the ISPP voltage increment to the third level $\Delta V_{ISPP3}$, and apply a program pulse of the set voltage level. In this case, the memory device 200 may increase a length of a period to which the program pulse is applied at D1 by D2. In another example, referring to FIG. 9, the memory device 200 may identify that the threshold voltages of the memory cells follow the third distribution 930, set the level of the ISPP voltage increment to the first level $\Delta V_{ISPP1}$, add the offset voltage +OFFSET, set the voltage level of the program operation of the second program loop $2^{nd}$ Loop, and apply the program pulse of the set voltage level for D2 time.

According to various example embodiments, in order to prevent or hinder the over program from occurring by increasing the width of the program pulse, the memory device 200 may apply the program pulse of the voltage level smaller than the compensation value of the program operation voltage level determined in the table of FIG. 8 for the D2 time, based on the first count value and the second count value. For example, it may be assumed that the first count value X is 100 bits and the second count value Y is 210 bits. Referring to FIG. 8 together, because 'X+Y' exceeds 300 bits and 'X' exceeds 90 bits, the compensation value of the program voltage level of the second program loop $2^{nd}$ Loop may correspond to 550 mV. In order to prevent or hinder the over program from occurring, the memory device 200 may apply the program pulse at the voltage level of 500 mV excluding the offset voltage for the D2 time, reduce the level of the ISPP voltage increment while maintaining the offset voltage, and apply the program pulse at the voltage level of 450 mV for the D2 time.

According to the above-described example embodiments, the memory device 200 shows compensation for a word line of the second program loop $2^{nd}$ Loop. For example, the memory device 200 may vary the voltage level of the program operation of the second program loop $2^{nd}$ Loop, increase the width of the program pulse, or increase the number of times of application of the program pulse based on the distribution shape of the threshold voltage identified through the verify operation of the first program loop $1^{st}$ Loop. However, the memory device 200 according to some example embodiments is not limited to only compensation for word lines, and compensation for bit lines may also be performed. According to some example embodiments, the memory device 200 may set different bit line levels with respect to memory cells. For example, the memory device 200 may set the bit line level of the second memory cells having threshold voltages higher than the first voltage level VL1 and lower than the second voltage level VL2 to a first BL level, and set the bit line level of the third memory cells having threshold voltages higher than the second voltage level VL2 and lower than the third voltage level VL3 to a second BL level. The second BL level may be greater than the first BL level.

Figure 11:
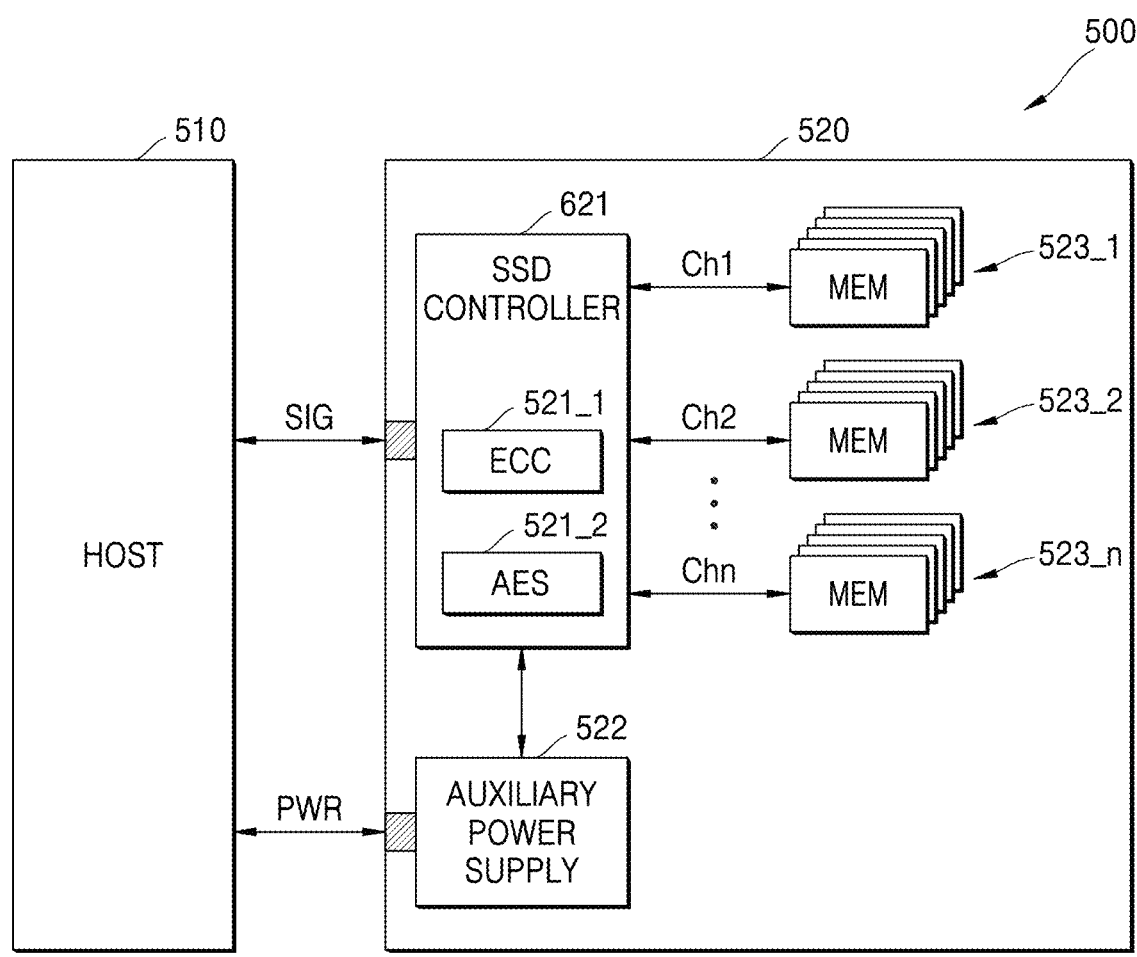
FIG. 11 is a block diagram illustrating an example of to a solid state drive (SSD) system to which memory devices are applied according to some example embodiments of the inventive concepts.

FIG. 11 is a block diagram illustrating an example of to a solid state drive (SSD) system 500 to which memory devices 523_1 to 523_n are applied according to some example embodiments of the inventive concepts.

Referring to FIG. 11, the SSD system 500 may include a host 510 and an SSD 520. The SSD 520 exchanges a signal SIG with the host 510 through a signal connector, and receives power PWR through a power connector. The SSD 520 may include an SSD controller 521, an auxiliary power supply 522, and the memory devices 523_1 to 523_n. The memory devices 523_1 to 523_n may be vertically stacked NAND flash memory devices. The SSD controller 521 may be connected to each of the memory devices 523_1 to 523_n through a plurality of channels Ch1 to Chn. In this case, each of the memory devices 523_1 to 523_n may be implemented using some example embodiments described above with reference to FIGS. 1 to 10. That is, the memory devices 523_1 to 523_n may estimate a distribution shape in a preceding program loop through EO sensing (EOS), and compensate for a program voltage level of a following program loop according to the estimated distribution shape.

The SSD controller 521 may include an error correction code (ECC) circuit 521_1 and an advanced encryption standard (AES) circuit 521_2. Besides, although not shown in FIG. 11, the SSD controller 521 may further include components such as a processor, a buffer, a random access memory (RAM), a host interface, and a memory interface for controlling the overall operation of the SSD 520.

The ECC circuit 521_1 may perform ECC encoding and ECC decoding processing on data stored in the memory devices 523_1 to 523_n or read from the memory devices 523_1 to 523_n. For example, the ECC circuit 521_1 may generate parity used for error detection and correction through ECC encoding processing on write data, and perform error detection and correction based on the data read from the memory devices 523_1 to 523_n and the parity. In addition, the AES circuit 521_2 may perform at least one of an encryption operation and a decryption operation on data input/output to/from the SSD controller 521, and perform the encryption/decryption operations using various types of encryption/decryption algorithms (e.g., a symmetric-key algorithm).

Figure 12:
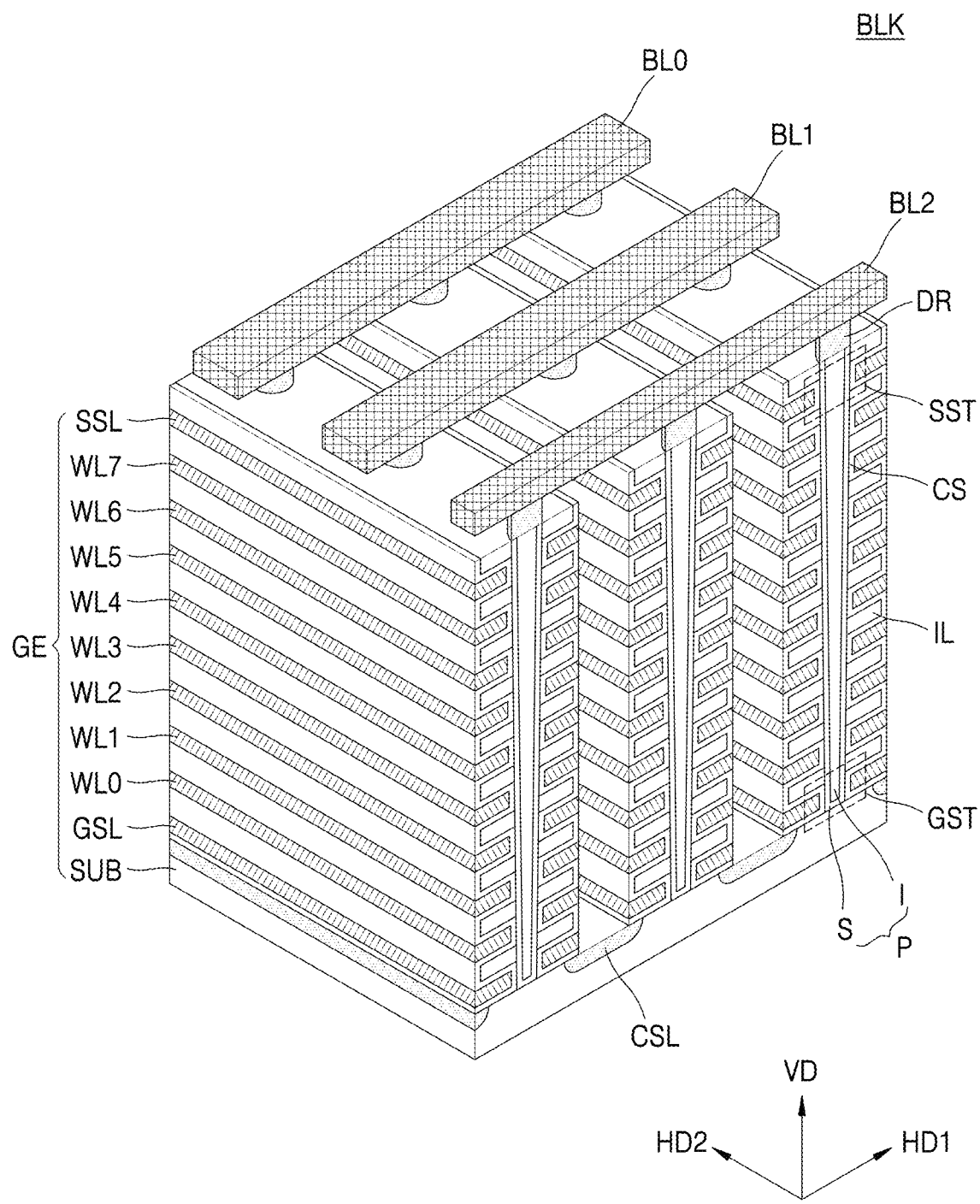
FIG. 12 is a perspective view illustrating an implementation example of a memory block of FIG. 2 according to some example embodiments.

FIG. 12 is a perspective view illustrating an implementation example of the memory block BLK of FIG. 2 according to some example embodiments.

Referring to FIG. 12, the memory block BLK is formed in a vertical direction with respect to the substrate SUB. The substrate SUB provides common source lines CSL having a first conductivity type (e.g., p-type), extending in a second horizontal direction HD2, and doped with impurities of a second conductivity type (e.g., n-type). A plurality of insulating layers IL extending in the second horizontal direction HD2 are sequentially provided in a vertical direction VD on a region of the substrate SUB between the two adjacent common source lines CSL, and are spaced apart from each other by a specific distance in the vertical direction VD. For example, the plurality of insulating layers IL may include an insulating material such as silicon oxide.

A plurality of pillars P sequentially disposed in a first horizontal direction HD1, and penetrating the plurality of insulating layers IL in the vertical direction VD are provided on the region of the substrate SUB between two adjacent common source lines CSL. For example, the plurality of pillars P may penetrate the plurality of insulating layers IL to make contact with the substrate SUB. Specifically, a surface layer S of each pillar P may include a first type silicon material and function as a channel region. Meanwhile, an inner layer I of each pillar P may include an insulating material such as silicon oxide or an air gap.

On the region between two adjacent common source lines CSL, a charge storage layer CS is provided along exposed surfaces of the insulating layers IL, the pillars P, and the substrate SUB. The charge storage layer CS may include a gate insulating layer (also referred to as a 'tunneling insulating layer'), a charge trapping layer, and a blocking insulating layer. For example, the charge storage layer CS may have an oxide-nitride-oxide (ONO) structure. In addition, in the region between the two adjacent common source lines CSL, on an exposed surface of the charge storage layer CS, gate electrodes GE such as the selection lines GSL and SSL and the word lines WL0 to WL7 are provided.

Drains or drain contacts DR are provided on the plurality of pillars P, respectively. For example, the drains or the drain contacts DR may include a silicon material doped with impurities having a second conductivity type. Bit lines BL1 to BL3 extending in the first horizontal direction HD1 and spaced apart from each other by a specific distance in the second horizontal direction HD2 are provided on the drains DR.

Figure 13:
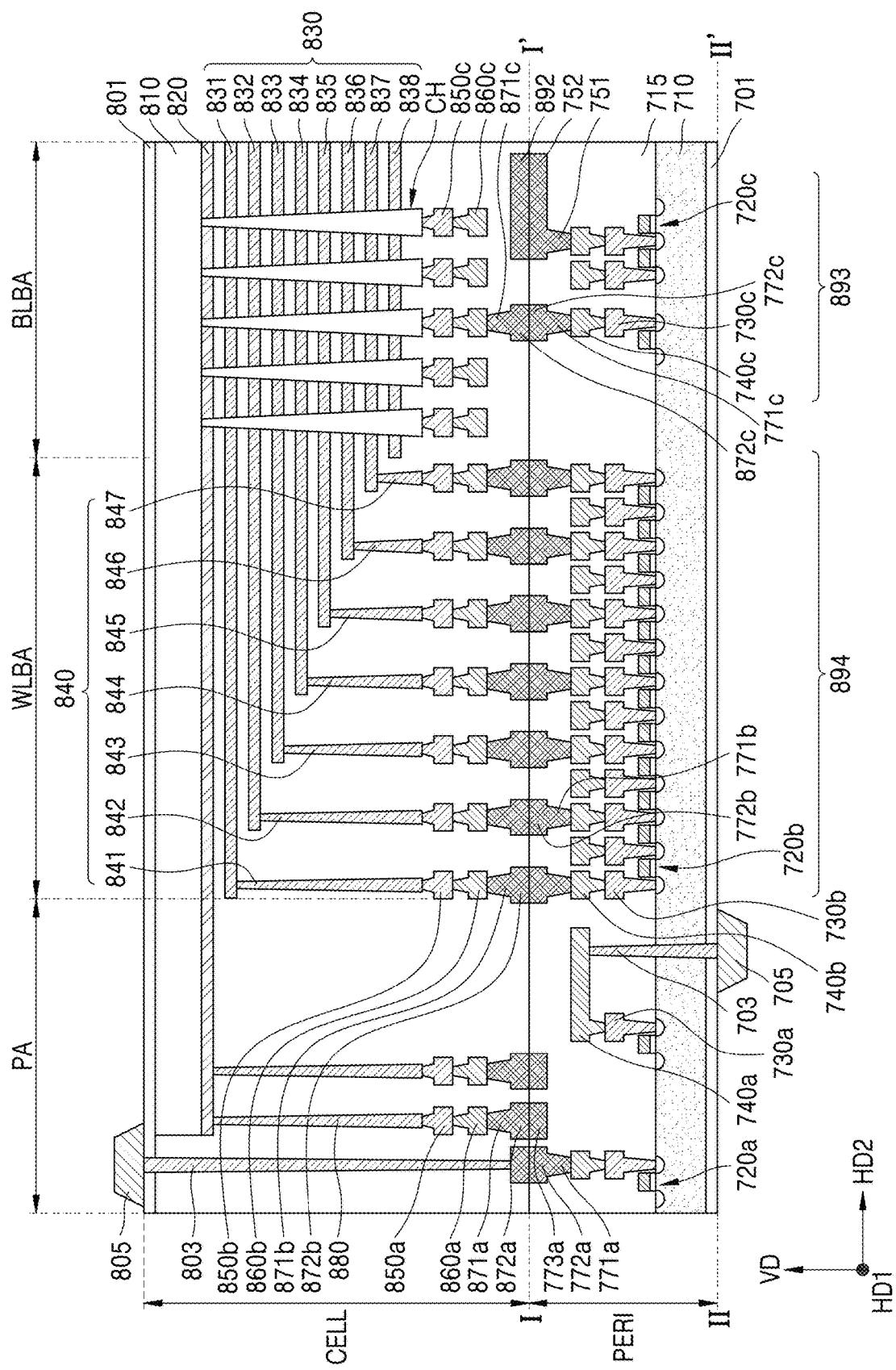
FIG. 13 is a cross-sectional view illustrating a memory device according to some example embodiments.

FIG. 13 is a cross-sectional view illustrating a memory device 600 according to some example embodiments.

Referring to FIG. 13, the memory device 600 may have a chip to chip (C2C) structure. The C2C structure may mean fabricating an upper chip including a cell area CELL on a first wafer, fabricating a lower chip including a peripheral circuit area PERI on a second wafer different from the first wafer, and then, connecting the upper chip and the lower chip to each other by a bonding method. For example, the bonding method may refer to a method of electrically connecting a bonding metal formed on the uppermost metal layer of the upper chip and a bonding metal formed on the uppermost metal layer of the lower chip to each other. For example, when the bonding metal is formed of copper (Cu), the bonding method may be a Cu—Cu bonding method, and the bonding metal may be formed of aluminum or tungsten. The example embodiments illustrated in FIGS. 1 to 12 may be implemented in the memory device 600, and for example, the page buffer described above with reference to FIGS. 1 to 12 may be disposed in the peripheral circuit area PERI.

Each of the peripheral circuit area PERI and the cell area CELL of the memory device 600 may include an external pad bonding area PA, a word line bonding area WLBA, and a bit line bonding area BLBA. The peripheral circuit area PERI may include a first substrate 710, an interlayer insulating layer 715, a plurality of circuit elements 720a, 720b, and 720c formed on the first substrate 710, first metal layers 730a, 730b, and 730c respectively connected to the plurality of circuit elements 720a, 720b, and 720c, and second metal layers 740a, 740b, and 740c respectively formed on the first metal layers 730a, 730b, and 730c. In some example embodiments, the first metal layers 730a, 730b, and 730c may be formed of tungsten having a relatively high resistance, and the second metal layers 740a, 740b, and 740c may be formed of copper having a relatively low resistance.

In the present specification, only the first metal layers 730a, 730b, 730c and the second metal layers 740a, 740b, and 740c are shown and described, but not limited thereto. At least one or more metal layers may be further formed on the second metal layers 740a, 740b, and 740c. At least some of the one or more metal layers formed on the second metal layers 740a, 740b, and 740c may be formed of aluminum having a lower resistance than that of copper forming the second metal layers 740a, 740b, and 740c.

The interlayer insulating layer 715 may be disposed on the first substrate 710 to cover the plurality of circuit elements 720a, 720b, and 720c, the first metal layers 730a, 730b, and 730c, and the second metal layers 740a, 740b, and 740c and include an insulating material such as silicon oxide, silicon nitride, etc.

Lower bonding metals 771b and 772b may be formed on the second metal layer 740b of the word line bonding area WLBA. In the word line bonding area WLBA, the lower bonding metals 771b and 772b of the peripheral circuit area PERI may be electrically connected to upper bonding metals 871b and 872b of the cell area CELL by the bonding method, and the lower bonding metals 771b and 772b and the upper bonding metals 871b and 872b may be formed of aluminum, copper, tungsten, etc. The upper bonding metals 871b and 872b of the cell area CELL may be referred to as first metal pads, and the lower bonding metals 771b and 772b of the peripheral circuit area PERI may be referred to as second metal pads.

The cell area CELL may provide at least one memory block. The cell area CELL may include a second substrate 810 and a common source line 820. A plurality of word lines 830; 831 to 838 may be stacked on the second substrate 810 in a direction VD perpendicular to an upper surface of the second substrate 810. String selection lines and ground selection lines may be disposed on upper and lower portions of the word lines 830, respectively, and the plurality of word lines 830 may be disposed between the string selection lines and the ground selection line.

In the bit line bonding area BLBA, the channel structure CH may extend in a direction perpendicular to the upper surface of the second substrate 810 and penetrate the word lines 830, the string selection lines, and the ground selection line. The channel structure CH may include a data storage layer, a channel layer, a buried insulating layer, etc., and the channel layer may be electrically connected to a first metal layer 850c and a second metal layer 860c. For example, the first metal layer 850c may be a bit line contact, and the second metal layer 860c may be a bit line. In some example embodiments, the bit line may extend in the first horizontal direction HD1 parallel to the upper surface of the second substrate 810.

In an example embodiments shown in FIG. 13, an area in which the channel structure CH and the bit line are disposed may be defined as the bit line bonding area BLBA. The bit line may be electrically connected to the circuit elements 720c providing a page buffer 893 in the peripheral circuit area PERI and the bit line bonding area BLBA. For example, the bit line may be connected to the upper bonding metals 871c and 872c in the peripheral circuit area PERI, and the upper bonding metals 871c and 872c may be connected to the lower bonding metals 771c and 772c connected to the circuit elements 720c of the page buffer 893. In some example embodiments of the inventive concepts, the bit line may be connected to the page buffer 893, and various set-up operations may be performed on the bit line to perform ISPP including the first program loop $1^{st}$ Loop and the second program loop $2^{nd}$ Loop. In addition, in some example embodiments of the inventive concepts, in order to perform EO sensing, according to the first voltage level VL1 with respect to an even-numbered bit line, the second voltage level VL2 with respect to an even-numbered bit line and an odd-numbered bit line, and the third voltage level VL3 with respect to an odd-numbered bit line, read data may be provided to the page buffer 893, and the first count value and the second count value may be identified.

In the word line bonding area WLBA, the word lines 830 may extend in the second horizontal direction HD2 parallel to the upper surface of the second substrate 810, and may be connected to a plurality of cell contact plugs 840: 841 to 847. The word lines 830 and the cell contact plugs 840 may be connected to each other through pads provided by at least some of the word lines 830 extending in different lengths in the second horizontal direction HD2. A first metal layer 850b and a second metal layer 860b may be sequentially connected to upper portions of the cell contact plugs 840 connected to the word lines 830. The cell contact plugs 840 may be connected to the peripheral circuit area PERI through the upper bonding metals 871b and 872b of the cell area CELL and the lower bonding metals 771b and 772b of the peripheral circuit area PERI through the peripheral circuit in the word line bonding area WLBA.

The cell contact plugs 840 may be electrically connected to the circuit elements 720b providing the row decoder 894 in the peripheral circuit area PERI. In some example embodiments, operating voltages of the circuit elements 720b providing the row decoder 894 may be different from operating voltages of the circuit elements 720c providing the page buffer 893. For example, the operating voltages of the circuit elements 720c providing the page buffer 893 may be greater than the operating voltages of the circuit elements 720b providing the row decoder 894.

A common source line contact plug 880 may be disposed in an external pad bonding area PA. The common source line contact plug 880 may be formed of a metal, a metal compound, or a conductive material such as polysilicon, and may be electrically connected to the common source line 820. A first metal layer 850*a* and a second metal layer 860*a* may be sequentially stacked on the common source line contact plug 880. For example, an area in which the common source line contact plug 880, the first metal layer 850*a*, and the second metal layer 860*a* are disposed may be defined as the external pad bonding area PA.

Meanwhile, input/output pads 705 and 805 may be disposed in the external pad bonding area PA. Referring to FIG. 13, a lower insulating layer 701 covering a lower surface of the first substrate 710 may be formed on a lower portion of the first substrate 710, and the first input/output pad 705 may be formed on the lower insulating layer 701. The first input/output pad 705 may be connected to at least one of the plurality of circuit elements 720*a*, 720*b* and 720*c* disposed in the peripheral circuit area PERI through the first input/output contact plug 703, and separated from the first substrate 710 by the lower insulating layer 701. In addition, a side insulating layer may be disposed between the first input/output contact plug 703 and the first substrate 710 to electrically separate the first input/output contact plug 703 from the first substrate 710.

Referring to FIG. 13, an upper insulating layer 801 covering the upper surface of the second substrate 810 may be formed on the upper surface of the second substrate 810, and the second input/output pad 805 may be disposed on the upper insulating layer 801. The second input/output pad 805 may be connected to at least one of the plurality of circuit elements 720*a*, 720*b*, and 720*c* disposed in the peripheral circuit area PERI through the second input/output contact plug 803.

According to some example embodiments, the second substrate 810 and the common source line 820 may not be disposed in a region where the second input/output contact plug 803 is disposed. Also, the second input/output pad 805 may not overlap the word lines 830 in a third direction (Z-axis direction). Referring to FIG. 13, the second input/output contact plug 803 may be separated from the second substrate 810 in a direction parallel to the upper surface of the second substrate 810, penetrate the interlayer insulating layer 815 of the cell area CELL, and be connected to the second input/output pad 805.

According to some example embodiments, the first input/output pad 705 and the second input/output pad 805 may be selectively formed. For example, the memory device 600 may include only the first input/output pad 705 disposed on the upper portion of the first substrate 710, or only the second input/output pad 805 disposed on the upper portion of the second substrate 810. Alternatively, the memory device 600 may include both the first input/output pad 705 and the second input/output pad 805.

On each of the external pad bonding area PA and the bit line bonding area BLBA respectively included in the cell area CELL and the peripheral circuit area PERI, a metal pattern of the uppermost metal layer may exist as a dummy pattern, or the uppermost metal layer may be empty.

In the external pad bonding area PA, the memory device 600 may form a lower metal pattern 773*a* having the same shape as that of an upper metal pattern 872*a* of the cell area CELL in the uppermost metal layer of the peripheral circuit area PERI in correspondence to the upper metal pattern 872*a* formed on the uppermost metal layer of the cell area CELL. The lower metal pattern 773*a* formed on the uppermost metal layer of the peripheral circuit area PERI may not be connected to a separate contact in the peripheral circuit area PERI. Similarly, in the external pad bonding area PA, the memory device 600 may form an upper metal pattern having the same shape as that of a lower metal pattern of the peripheral circuit area PERI on the upper metal layer of the cell area CELL in correspondence to the lower metal pattern formed on the uppermost metal layer of the peripheral circuit area PERI.

Lower bonding metals 771*b* and 772*b* may be formed on the second metal layer 740*b* of the word line bonding area WLBA. In the word line bonding area WLBA, the lower bonding metals 771*b* and 772*b* of the peripheral circuit area PERI may be electrically connected to the upper bonding metals 871*b* and 872*b* of the cell area CELL by the bonding method.

In addition, in the bit line bonding area BLBA, the memory device 600 may form an upper metal pattern 892 having the same shape as that of the lower metal pattern 752 of the peripheral circuit area PERI on the uppermost metal layer of the cell area CELL in correspondence to the lower metal pattern 752 formed on the uppermost metal layer of the peripheral circuit area PERI. A contact may not be formed on the upper metal pattern 892 formed on the uppermost metal layer of the cell area CELL.

Any of the elements and/or functional blocks disclosed above may include or be implemented in processing circuitry such as hardware including logic circuits; a hardware/software combination such as a processor executing software; or a combination thereof. For example, the control logic 230 and SSD controller 621 may be implemented as processing circuitry. The processing circuitry specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

While the inventive concepts have been particularly shown and described with reference to example embodiments thereof, it will be understood that various changes in form and details may be made therein without departing from the scope of the following claims.

What is claimed is:

1. A memory device comprising:
   a memory cell array comprising a plurality of memory cells;
   a voltage generator configured to generate voltages for one or more program operations and a verify operation, the one or more program operations and the verify operation being performed on the plurality of memory cells;
   a control logic configured to perform a control operation on the plurality of memory cells so that a first program loop, and a second program loop are performed, the first program loop comprising a first program operation among the one or more program operations and a first verify operation, the second program loop comprising a second program operation among the one or more program operations, the second program operation being performed based on a compensation voltage level determined based on a result of the first verify operation; and a plurality of bit lines connected to the memory cell array, wherein the first verify operation comprises first even sensing and second even sensing on even-numbered bit lines among the plurality of bit lines, and first odd sensing and second odd sensing on odd-numbered bit lines among the plurality of bit lines;

wherein the control logic is further configured to
set a difference value between an on-cell number of the first even sensing and an on-cell number of the second even sensing as a first count value, and
set a difference value between an on-cell number of the first odd sensing and an on-cell number of the second odd sensing as a second count value, the first count value corresponds to a first number of memory cells having a threshold voltage greater than a first voltage level of the first even sensing and less than a second voltage level of the second even sensing, and the second count value corresponds to a second number of memory cells having a threshold voltage greater than the second voltage level of the first odd sensing and less than a third voltage level of the second odd sensing.

2. The memory device of claim 1, wherein the control logic is configured to perform the first even sensing, the second even sensing, the first odd sensing, and the second odd sensing such that
the first even sensing is performed on the even-numbered bit lines at a first time after a first bit line of the plurality of bit lines is completely precharged,
the second even sensing is performed on the even-numbered bit lines at a second time later than the first time,
the first odd sensing is performed on the odd-numbered bit lines at the second time after the first bit line is completely precharged, and
the second odd sensing is performed on the odd-numbered bit lines at a third time later than the second time.

3. The memory device of claim 1, wherein the control logic is further configured to determine
a first condition for determining whether the second count value is greater than the first count value based on the first count value and the second count value,
a second condition for determining whether a sum of the first count value and the second count value is less than a threshold value, and
a third condition for determining whether the first count value is less than a second threshold value.

4. The memory device of claim 3,
wherein the control logic is further configured to
determine an incremental step pulse program (ISPP) voltage level of the second program loop based on a result of the second condition, and
determine whether to add an offset voltage to the ISPP voltage level based on a result of the third condition.

5. The memory device of claim 4 wherein the control logic is further configured to, in response to identifying that the first condition is not satisfied, increase the ISPP voltage level of the second program loop, and increase the offset voltage added to the ISPP voltage level.

6. The memory device of claim 1, wherein each of the plurality of memory cells is a single level cell that stores one bit per cell.

7. A method of operating a memory device, the method comprising:

performing a first program loop comprising a first program operation and a first verify operation on a plurality of memory cells;

determining a compensation voltage level based on a result of the first verify operation; and performing a second program loop comprising a second program operation, the second program operation being performed based on the determined compensation voltage level, wherein the first verify operation comprises first even sensing and second even sensing on even-numbered bit lines of the memory device, and first odd sensing and second odd sensing on odd-numbered bit lines of the memory device;

setting a difference value between an on-cell number of the first even sensing and an on- cell number of the second even sensing as a first count value; and setting a difference value between an on-cell number of the first odd sensing and an on- cell number of the second odd sensing as a second count value, wherein the first count value corresponds to a number of memory cells having a threshold voltage greater than a first voltage level of the first even sensing and less than a second voltage level of the second even sensing, and wherein the second count value corresponds to a number of memory cells having a threshold voltage greater than a third voltage level of the first odd sensing and less than a fourth voltage level of the second odd sensing.

8. The method of claim 7, wherein the performing of the first verify operation further comprises:
performing the first even sensing on the even-numbered bit lines at a first time after completely precharging a first bit line;
performing the second even sensing on the even-numbered bit lines at a second time later than the first time;
performing the first odd sensing on the odd-numbered bit lines at the second time; and
performing the second odd sensing on the odd-numbered bit lines at a third time later than the second time.

9. The method of claim 7, further comprising:
determining a first condition for determining whether the second count value is greater than the first count value based on the first count value and the second count value;
determining a second condition for determining whether a sum of the first count value and the second count value is less than a threshold value; and
determining a third condition for determining whether the first count value is less than a second threshold value.

10. The method of claim 9, wherein the determining of the compensation voltage level determined based on the result of the first verify operation comprises:
determining an incremental step pulse program (ISPP) voltage level of the second program loop based on a result of the second condition, and
determining whether to add an offset voltage to the ISPP voltage level based on a result of the third condition.

11. The method of claim 10, wherein the determining of the compensation voltage level determined based on the result of the first verify operation further comprises:
identifying that the first condition is not satisfied;
increasing the ISPP voltage level of the second program loop; and
increasing the offset voltage added to the ISPP voltage level.

12. The method of claim 7, wherein each of the plurality of memory cells is a single level cell that stores one bit per cell.

13. A memory device comprising:
- a memory cell array comprising a plurality of single level cells configured to store one bit per cell;
- a voltage generator configured to generate voltages for one or more program operations and a first verify operation, the one or more program operations and the first verify operation being performed on the memory cell array;
- a control logic configured to perform a control operation on the memory cell array so that a first program loop and a second program loop are performed, the first program loop comprising a first program operation among the one or more program operations, the second program loop comprising a second program operation among the one or more program operations, the second program operation being performed based on a compensation voltage level determined based on a result of the first verify operation; and
- a plurality of bit lines connected to the memory cell array,
  wherein the first verify operation comprises obtaining first count values based on a difference between a first even sensing and a second even sensing on an even-numbered bit line among the plurality of bit lines, obtaining a second count value based on a difference between a first odd sensing and a second odd sensing on an odd-numbered bit line among the plurality of bit lines, and determining whether the first count value and the second count value satisfy a plurality of pass conditions.

14. The memory device of claim 13, wherein the plurality of pass conditions comprise a first condition for determining whether the second count value is greater than the first count value based on the first count value and the second count value, a second condition for determining whether a sum of the first count value and the second count value is less than a threshold value, and a third condition for determining whether the first count value is less than a second threshold value.

15. The memory device of claim 14,
wherein the control logic is further configured to,
- in response to the sum of the first count value and the second count value being included in a first range, set an incremental step pulse program (ISPP) voltage level of the second program loop to a first level, and
- in response to the sum of the first count value and the second count value being included in a second range of values smaller than the first range, set the ISPP voltage level of the second program loop to a second level of a voltage value lower than the first level.

16. The memory device of claim 15,
wherein the control logic is further configured to,
- in response to the first count value being included in a third range, add an offset voltage to the ISPP voltage level set to the first level, and
- in response to the first count value being included in a fourth range of values smaller than the third range, add the offset voltage to the ISPP voltage level set to the second level.

17. The memory device of claim 16, further comprising:
in response to identifying that the first condition is not satisfied, increasing the ISPP voltage level of the second program loop, and increasing the offset voltage added to the ISPP voltage level.

18. The memory device of claim 13, wherein a time at which the second even sensing is performed overlaps a time at which the first odd sensing is performed.

* * * * *